US010943045B2

(12) United States Patent
Biswas et al.

(10) Patent No.: US 10,943,045 B2
(45) Date of Patent: Mar. 9, 2021

(54) SEMICONDUCTOR DEVICE INCLUDING STANDARD-CELL-ADAPTED POWER GRID ARRANGEMENT AND METHOD FOR GENERATING LAYOUT DIAGRAM OF SAME

(71) Applicant: TAIWAN SEMICONDUCTOR MANUFACTURING COMPANY, LTD., Hsinchu (TW)

(72) Inventors: Hiranmay Biswas, Kolkata (IN); Chung-Hsing Wang, Baoshan Township (TW); Chin-Shen Lin, Taipei (TW); Kuo-Nan Yang, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 237 days.

(21) Appl. No.: 16/222,855

(22) Filed: Dec. 17, 2018

(65) Prior Publication Data
US 2019/0236234 A1 Aug. 1, 2019

Related U.S. Application Data

(60) Provisional application No. 62/624,732, filed on Jan. 31, 2018.

(51) Int. Cl.
*G06F 17/50* (2006.01)
*H01L 23/52* (2006.01)
(Continued)

(52) U.S. Cl.
CPC ........ *G06F 30/392* (2020.01); *H01L 23/5226* (2013.01); *H01L 23/5286* (2013.01);
(Continued)

(58) Field of Classification Search
CPC ............. H01L 23/5226; H01L 23/5286; H01L 23/53271; G06F 30/392; G06F 30/394; G06F 30/3947; G06F 30/3953
(Continued)

(56) References Cited

U.S. PATENT DOCUMENTS

| 5,742,099 A | 4/1998 | Debnath et al. |
| 5,767,011 A | 6/1998 | Yao et al. |

(Continued)

FOREIGN PATENT DOCUMENTS

| WO | 2004012107 A2 | 2/2004 |
| WO | 2004077556 A1 | 9/2004 |

*Primary Examiner* — Phallaka Kik
(74) *Attorney, Agent, or Firm* — Hauptman Ham, LLP

(57) ABSTRACT

A semiconductor device includes: a power grid (PG) arrangement including: a conductive layer M(i) including segments which are conductive, where i is an integer and i≥0; and a conductive layer M(i+1) over the conductive layer M(i), the conductive layer M(i+1) including segments which are conductive; the M(i) segments including first and second segments designated correspondingly for first and second reference voltages, the first and second segments being interspersed and substantially parallel to a first direction; and the segments in the conductive layer M(i+1) including third and fourth segments designated correspondingly for the first and second reference voltages; the third and fourth segments being interspersed and substantially parallel to a perpendicular second direction; and wherein the segments in the conductive layer M(i+1) are arranged substantially asymmetrically such that each fourth segment is located, relative to the first direction, substantially asymmetrically between corresponding adjacent ones of the third segments.

20 Claims, 11 Drawing Sheets

(51) Int. Cl.
  *G06F 30/392* (2020.01)
  *H01L 23/522* (2006.01)
  *H01L 23/532* (2006.01)
  *H01L 23/528* (2006.01)
  *G06F 30/3947* (2020.01)
  *G06F 30/3953* (2020.01)

(52) U.S. Cl.
  CPC .... *H01L 23/53271* (2013.01); *G06F 30/3947* (2020.01); *G06F 30/3953* (2020.01)

(58) Field of Classification Search
  USPC .... 716/120, 127, 129, 130, 131; 326/41, 47, 326/101
  See application file for complete search history.

(56) References Cited

U.S. PATENT DOCUMENTS

| | | | |
|---|---|---|---|
| 7,260,442 | B2 | 8/2007 | Hwang et al. |
| 7,943,966 | B2 * | 5/2011 | Becker .............. H01L 21/28123 |
| | | | 257/206 |
| 9,256,709 | B2 | 2/2016 | Yu et al. |
| 2009/0032846 | A1 | 2/2009 | Ho |
| 2010/0044875 | A1 | 2/2010 | Hsu |
| 2012/0056647 | A1 * | 3/2012 | Nagatsuka ........ H01L 21/02631 |
| | | | 327/109 |
| 2014/0040838 | A1 | 2/2014 | Liu et al. |
| 2015/0278429 | A1 | 10/2015 | Chang |
| 2018/0151496 | A1 * | 5/2018 | Biswas ............. H01L 21/76816 |
| 2019/0065659 | A1 * | 2/2019 | Biswas ................... G06F 30/36 |

* cited by examiner

US 10,943,045 B2

SEMICONDUCTOR DEVICE INCLUDING STANDARD-CELL-ADAPTED POWER GRID ARRANGEMENT AND METHOD FOR GENERATING LAYOUT DIAGRAM OF SAME

BACKGROUND

An integrated circuit ("IC") includes one or more semiconductor devices. One way in which to represent a semiconductor device is with a plan view diagram referred to as a layout diagram. A layout diagram is hierarchical and is decomposed into modules which carry out higher-level functions as required by the IC's design specifications. In some circumstances, a semi-custom design (SCD) project decomposes the modules into macro cells, standard cells and custom cells.

For a given SCD project, a custom cell is designed with an arrangement that is specific to the given SCD project in order to provide (in operation) a higher-level logic function that is specific to the SCD project. By contrast, a standard cell is designed with no particular project in mind, and a library of standard cells includes standard cells which provide (in operation) common, lower-level logic functions. In terms of a footprint within a layout diagram, custom cells are larger (typically much larger) than standard cells. Moreover, for a given library, all of the standard cells have at least one dimension which is the same size (typically, the size being a multiple of a library-specific fixed dimension) in order to facilitate placement of the standard cells into a layout diagram. As such, standard cells are described as being predefined with respect to a given SCD project. Custom cells may or may not have at least one dimension that is the same size as the corresponding dimension of the standard cells.

BRIEF DESCRIPTION OF THE DRAWINGS

One or more embodiments are illustrated by way of example, and not by limitation, in the figures of the accompanying drawings, wherein elements having the same reference numeral designations represent like elements throughout. The drawings are not to scale, unless otherwise disclosed.

DETAILED DESCRIPTION

Figure 1:
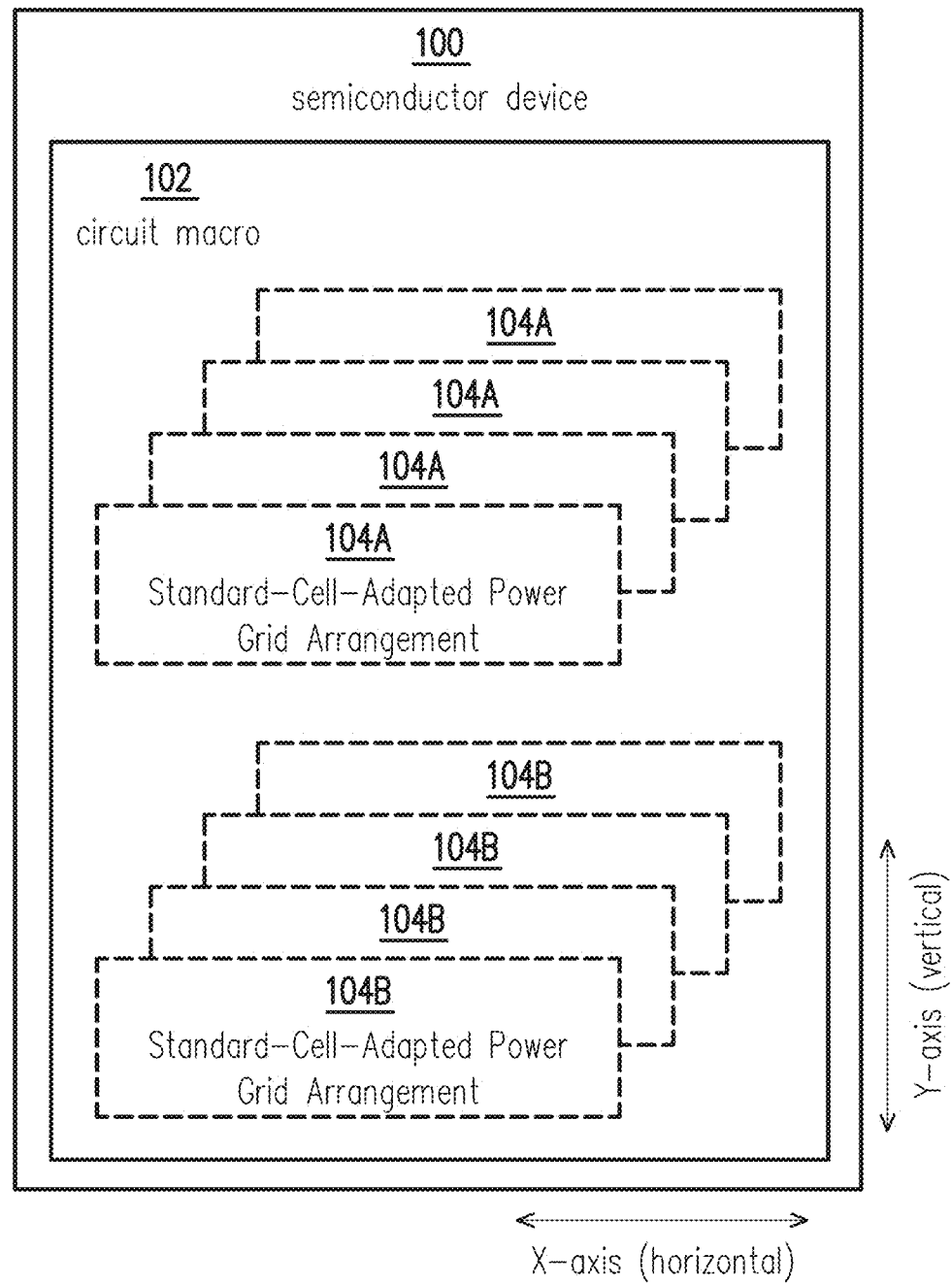
FIG. 1 is a block diagram of a semiconductor device, in accordance with some embodiments.

The following disclosure provides many different embodiments, or examples, for implementing different features of the provided subject matter. Specific examples of components, materials, values, steps, operations, materials, arrangements, or the like, are described below to simplify the present disclosure. These are, of course, merely examples and are not intended to be limiting. Other components, values, operations, materials, arrangements, or the like, are contemplated. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In some embodiments, for a power grid of a semiconductor device which includes stacked conductive $M(i)$ and $M(i+1)$ layers, where i is an integer and $i \geq 0$, the conductive layer $M(i+1)$ has an asymmetric arrangement of reference voltage straps/lines. In some embodiments, first and second reference voltages (e.g., correspondingly VDD and VSS) are provided by corresponding ones of the straps/lines. In some embodiments, in which the layer $M(i+1)$ has alternating first and second straps/lines, an asymmetric arrangement of the first and second straps/lines in the layer $M(i+1)$ is understood to mean, relative to a given direction (e.g., the horizontal direction), that each second strap/line is located, relative to the given direction, substantially asymmetrically between corresponding adjacent ones of the first strap/line. In some embodiments, a layout diagram corresponding to such a power grid (PG layout diagram) includes, among other things, strap/line patterns which correspond to the straps/lines of the power grid, the strap/line patterns having a corresponding asymmetric arrangement in the conductive layer M(i+1). Keeping in mind that pin patterns of standard cells represent other segments in layer M(i+1), such an asymmetric arrangement of the strap/line patterns in the conductive layer M(i+1) of the PG layout diagram reduces, if not eliminates, conflicts between the locations of strap patterns and possible locations of pin patterns of standard cells (conflict locations), where the pin patterns of the standard cells are located in the conductive layer M(i+1), which increases a number of unconflicted locations for the standard cells. In some embodiments, conflict locations are determined for layers other than layer M(i+1).

In some embodiments, strap/line patterns in each of the conductive layers M(i) and M(i+1) of a PG layout diagram are arranged symmetrically, wherein corresponding reference voltage segments in the conductive layer M(i+1) have a first pitch, portions of segments in the conductive M(i) layer with a length substantially equal to the first pitch have a corresponding stub resistance, and the first pitch of the conductive layer M(i+1) is sized to keep the stub resistance below a threshold resistance. In some embodiments, a corresponding method of generating a PG layout diagram takes into consideration the stub resistance, doing so by sizing the first pitch of the conductive layer M(i+1) so as to keep the stub resistance below the threshold resistance.

In some embodiments, a method of generating a PG layout diagram further takes into consideration location conflicts between the locations of strap patterns in layer M(i+1) of the power grid and pin patterns in layer M(i+1) of the standard cells (conflict locations), and accordingly makes an asymmetric arrangement of strap patterns in the layer M(i+1). In some embodiments, a conflict location in layer M(i+1) is a location in which a strap pattern in layer M(1+1) is located and which a pin pattern in layer M(i+1) possibly could be located. In some embodiments, conflict locations are determined for layers other than layer M(i+1). In some embodiments, in the context of PG layout diagrams, a benefit of using an asymmetric arrangement of strap patterns in the layer M(i+1) is that a number of possible unconflicted locations of standard cells is increased as compared to using a symmetric arrangement of the layer M(i+1). In some embodiments, an unconflicted location is a location in which one or the other of a strap pattern or a pin pattern is possibly located, but not both. In some embodiments, using a PG layout diagram which includes an asymmetric arrangement of strap patterns the layer M(i+1) and thus a larger number of unconflicted locations confers a benefit that it is easier to design a semiconductor device layout diagram which includes such a PG layout diagram because it is easier to place standard cells into such a PG layout diagram.

FIG. 1 is a block diagram of a semiconductor device 100, in accordance with at least one embodiment of the present disclosure.

In FIG. 1, semiconductor device 100 includes, among other things, a circuit macro (hereinafter, macro) 102. In some embodiments, macro 102 is an SRAM macro. In some embodiments, macro 102 is a macro other than an SRAM macro. Macro 102 includes, among other things, one or more standard-cell-adapted power grid arrangements 104A. In some embodiments, macro 102 includes, among other things, one or more power grid arrangements 104A which are adapted according to standard cells (standard-cell-adapted power grid arrangements 104A) and one or more standard-cell-adapted power grid arrangements 104B. In some embodiments where one or more standard-cell-adapted power grid arrangements 104A and one or more standard-cell-adapted power grid arrangements 104B are included, arrangement 104A differs from arrangement 104B. Examples of each of arrangement 104A and 104B include power grid arrangements in semiconductor devices fabricated based on corresponding power grid (PG) layout diagrams shown in each of FIGS. 2A, 2B, 3 and 4, or the like.

Figure 2A:
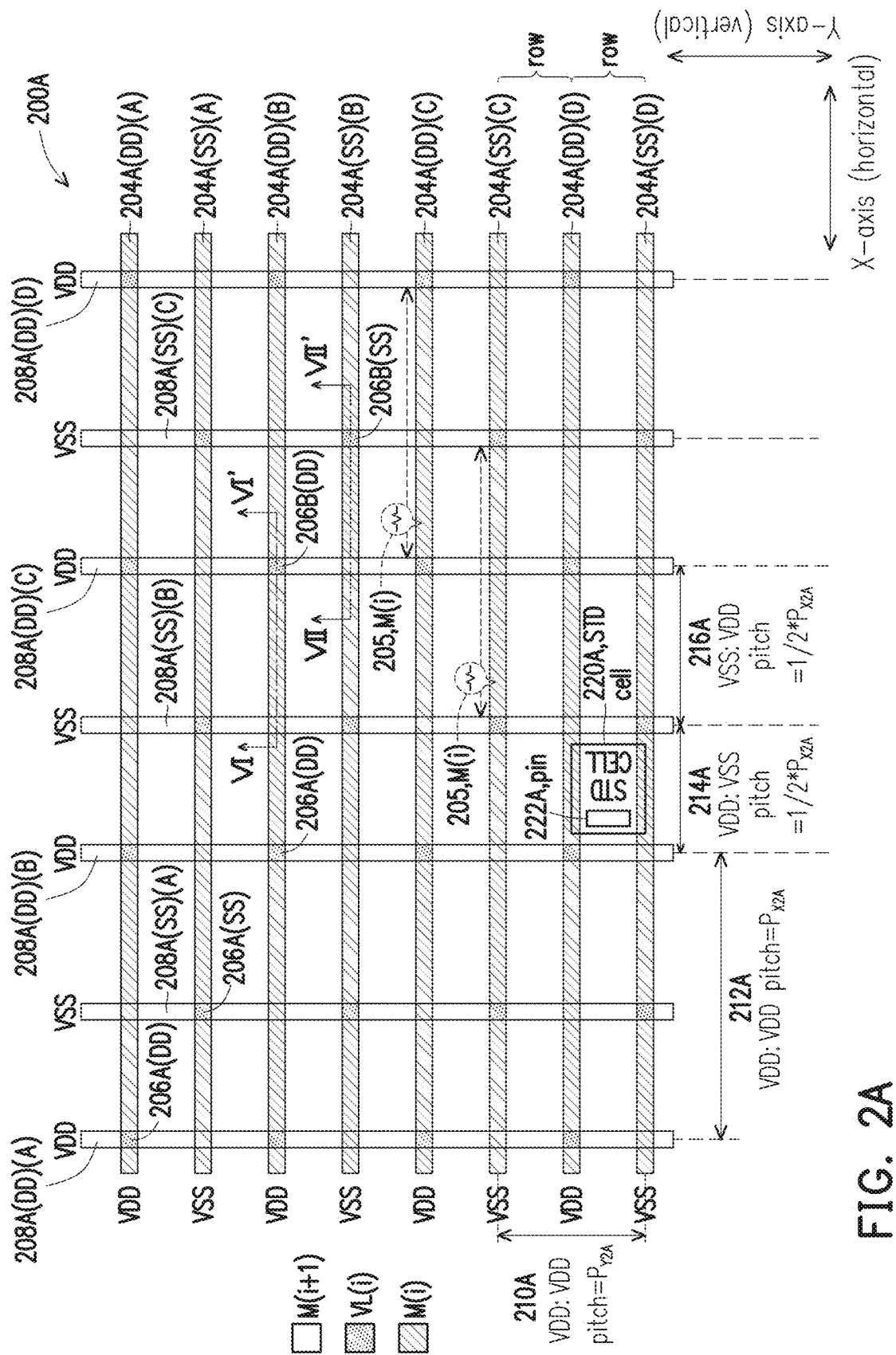
FIG. 2A is a power grid (PG) layout diagram of a symmetric arrangement of segment patterns in a power grid, in accordance with at least one embodiment of the present disclosure.

FIG. 2A is a power grid (PG) layout diagram 200A of a symmetric arrangement (discussed below) of conductive segments in a power grid, in accordance with at least one embodiment of the present disclosure. An example of a power grid arrangement based on PG layout diagram 200A is arrangement 104A and/or 104B included semiconductor device 100 of FIG. 1.

PG layout diagram 200A includes a layer M(i) of metallization, a layer M(i+1) of metallization over the layer M(i), and a layer VL(i) of contact patterns, e.g., via patterns, interposed between layers M(i) and M(i+1). The layer M(i) includes segment patterns representing corresponding segments of metallization in a semiconductor device, where i is an integer and i≥0. In some embodiments, the $i^{th}$ layer is the first layer of metallization, in which case i=0 or i=1 depending upon the numbering convention of the corresponding design rules. The layer M(i+1) includes segment patterns representing corresponding segments of metallization in a semiconductor device. The VL(i) layer includes via patterns representing contacts in a semiconductor device, where such contacts are substantially correspondingly aligned with intersections of segments in layer M(i) and corresponding segments in layer M(i+1). In some embodiments, the contacts in the layer VL(i) include vias. Examples of the layers M(i), VL(i) and M(i+1) are corresponding layers 631, 633 and 635 of FIG. 6 (discussed below) and corresponding layers 731, 733 and 735 of FIG. 7 (discussed below).

More particularly, in FIG. 2A, the segment patterns in layer M(i) include segment patterns 204A(DD)(A)-204A(DD)(D) interspersed with segment patterns 204A(SS)(A) 204A(SS)(D). In some embodiments, segment patterns 204A(DD)(A)-204A(DD)(D) are designated for a first reference voltage, and segment patterns 204A(SS)(A) 204A(SS)(D) are designated for a second reference voltage. In some embodiments, the first reference voltage is VDD. In some embodiments, the second reference voltage is VSS. The first and second segment patterns are substantially parallel to a first direction. The segment patterns in the layer M(i+1) include: segment patterns 208A(DD)(A)-208A(DD)(D) which are designated for the first reference voltage; and segment patterns 208A(SS)(A)-208A(SS)(C) which are designated for the second reference voltage. Segment patterns 208A(DD)(A)-208A(DD)(D) and 208A(SS)(A)-208A(SS)(C) are substantially parallel to a second direction, the second direction being perpendicular to the first direction. In some embodiments, the first direction is horizontal and the second direction is perpendicular.

In PG layout diagram 200A, the layer VL(i) includes via patterns 206A(DD) and 206A(SS). Via patterns 206A(DD) are substantially correspondingly aligned with intersections of segment patterns 204A(DD)(A)-204A(DD)(D) in layer M(i) and corresponding segment patterns 208A(DD)(A)-208A(DD)(D).

In FIG. 2A, the segment patterns in layer M(i) have a symmetric arrangement. In some embodiments, in which the layer M(i) has alternating first and second segments, a symmetric arrangement of the layer M(i) is understood to mean, relative to a given direction (e.g., the vertical direction), that each second segment is located, relative to the given direction, substantially symmetrically between corresponding adjacent ones of the first segments. Relative to the vertical direction, segment patterns 204A(DD)(A)-204A(DD)(D) and 204A(SS)(A)-204A(SS)(D) are separated by distances 210A which represent a pitch $P_{Y2A}$. In more detail, segment patterns 204A(DD)(A) and 204A(DD)(B) are separated by a distance 210A which represents pitch $P_{Y2A}$, segment patterns 204A(SS)(A) and 204A(SS)(B) are separated by a distance 210A which represents pitch $P_{Y2A}$, and so forth. In some embodiments, the pitch $P_{Y2A}$ is $P_{Y2A} \approx 8.4\text{CPP}$, where CPP represents a contacted polysilicon pitch of a corresponding semiconductor process/technology node, e.g., by which will be fabricated a semiconductor device corresponding to a semiconductor device layout diagram which includes PG layout diagram 200A. In some embodiments, the pitch $P_{Y2A}$ is a multiple of CPP other than 8.4CPP.

In PG layout diagram 200A, the segment patterns in layer M(i+1) have a symmetric arrangement. Relative to the horizontal direction, segment patterns 208A(DD)(A)-208A(DD)(D) and 208A(SS)(A)-208A(SS)(C) are separated by distances 212A which represent a pitch $P_{X2A}$. In more detail, segment patterns 208A(DD)(A) and 208A(DD)(B) are separated by a distance 212A, which represents the pitch $P_{X2A}$, segment patterns 208A(SS)(A) and 208A(SS)(B) are separated by a distance 212A, which represents the pitch $P_{X2A}$, segment patterns 208A(DD)(B) and 208A(DD)(C) are separated by a distance 212A, which represents the pitch $P_{X2A}$, segment patterns 208A(SS)(B) and 208A(SS)(C) are separated by a distance 212A, which represents the pitch $P_{X2A}$, and so forth. Also, segment patterns 208A(DD)(A) and 208A(SS)(A) are separated by a distance 214A, which represents a pitch $\frac{1}{2} * P_{X2A}$, segment patterns 208A(SS)(A) and 208A(DD)(B) are separated by a distance 216A, which represents a pitch $\frac{1}{2} * P_{X2A}$, and so forth.

In FIG. 2A, each portion of each of segment patterns 204A(DD)(A)-204(DD)(D) and 204A(SS)(A)-204A(SS)(D) with a length substantially equal to distance 212A, which (again) represents the pitch $P_{X2A}$, has a resistance referred to as stub resistance, $R_{STUB}$, which is shown as reference number 205 in PG layout diagram 200A. The pitch $P_{X2A}$ is sized to keep stub resistance 205 ($R_{THRESH}$) below a threshold resistance such that $R_{STUB} < R_{THRESH}$. The threshold resistance is determined according to layout design rules and a corresponding semiconductor process/technology node, e.g., by which will be fabricated a semiconductor device corresponding to a semiconductor device layout diagram which includes PG layout diagram 200A. In some embodiments, the pitch $P_{X2A}$ is $P_{X2A} = 30\text{CPP}$. In some embodiments, the pitch $P_{X2A}$ is $P_{X2A} = 28\text{CPP}$. In some embodiments, the pitch $P_{X2A}$ is an integer multiple of CPP other than 28 CPP or 30CPP.

In PG layout diagram 200A, in some embodiments, a benefit of sizing $P_{X2A}$ so as to keep the stub resistance ($R_{THRESH}$) below a threshold resistance is that a voltage drop between adjacent instances of segment patterns 208A(DD)(A)-208A(DD)(D) and adjacent instances of segment patterns 208A(SS)(A)-208A(SS)(C) is reduced below a reference value referred to as maximum delta. The maximum delta is determined according to layout design rules and a corresponding semiconductor process/technology node, e.g., by which will be fabricated a semiconductor device corresponding to a semiconductor device layout diagram which includes PG layout diagram 200A.

In some embodiments of PG layout diagram 200A, a ratio of the pitch $P_{Y2A}$ and the pitch $P_{X2A}$ is $P_{Y2A}/P_{X2A} \approx 8.4\text{CPP}/30\text{CPP}$. In some embodiments, the ratio has a value different than $P_{Y2A}/P_{X2A} \approx 8.4\text{CPP}/30\text{CPP}$. In some embodiments, the ratio is $P_{Y2A}/P_{X2A} \approx \frac{1}{4}$. In some embodiments, the ratio has a value different than $P_{Y2A}/P_{X2A} \approx \frac{1}{4}$.

It is to be recalled that PG layout diagram 200A is a grid. The grid includes rows. In particular, segment patterns 204A(DD)(A)-204A(DD)(D) and 204A(SS)(A)-204A(SS)(D) define corresponding rows of the grid. For example, a row is defined between segment patterns 204A(SS)(C) and 204A(DD)(D), a row is defined between segment patterns 204A(DD)(D) and 204A(SS)(D), and so forth.

Also shown in FIG. 2A is a standard cell 220A, which has been placed onto PG layout diagram 200A as a result of a process of designing a more comprehensive layout diagram (not shown) which includes PG layout diagram 200A and one or more standard cells such as standard cell 220A. In particular, standard cell 220A has been placed in the row defined between segment patterns 204A(DD)(D) and 204A(SS)(D). In some embodiments, standard cell 220A is placed in different locations within the row defined between segment patterns 204A(DD)(D) and 204A(SS)(D). In some embodiments, one or more additional instances of standard cell 220A are placed in different locations within the row defined between segment patterns 204A(DD)(D) and 204A(SS)(D). In some embodiments, one or more instances of standard cell 220A are placed in various locations in corresponding one or more rows of PG layout diagram 200A other than the row defined between segment patterns 204A(DD)(D) and 204A(SS)(D). In some embodiments, one or more additional instances of one or more standard cells other than standard cell 220A are placed into rows of PG layout diagram 200A.

Regarding PG layout diagram 200A, in some embodiments, standard cells, including standard cell 220A, are rectangular polygons. In some embodiments, the horizontal and vertical dimensions of a rectangular standard cell are described as the corresponding width and height of the cell. In some embodiments, the height of the standard cells, including standard cell 220A, is the same to facilitate placing the standard cells into the rows of PG layout diagram 200A.

In FIG. 2A, standard cell 220A includes a pin pattern 222A. In some embodiments, pin pattern 222A represents an input electrode or an output electrode of a corresponding cell region. As such, in some embodiments, pin pattern 222A represents an input electrode pattern or output electrode pattern. Pin pattern 222A is one of the segment patterns included in layer M(i+1). In FIG. 2A, standard cell 220A has been placed at a location within the row defined between segment patterns 204A(DD)(D) and 204A(SS)(D) which avoids a conflict between pin 222A and any of segment patterns 208A(DD)(A)-208A(DD)(D) and 208A(SS)(A)-208A(SS)(C).

In some embodiments, a conflict location is a location in which a strap pattern is located and which a pin pattern possibly could be located. For example, if locating both pin pattern 222A and any of segment patterns 208A(DD)(A)-208A(DD)(D) and 208A(SS)(A)-208A(SS)(C) in the same location in layer M(i+1), then the contemplated location represents a conflict location. Long axes of the segment patterns in layer M(i+1) of PG layout diagram 200B, which include segment patterns 208A(DD)(A)-208A(DD)(D) and 208A(SS)(A)-208A(SS)(C), and a long axis of pin pattern 222A, are substantially aligned with tracks (not shown) of the grid which PG layout diagram 200B represents. For example, if pin pattern 222A and a given one of segment patterns 208A(DD)(A)-208A(DD)(D) and 208A(SS)(A)-208A(SS)(C) were intended not only to be co-track aligned, but also were intended to overlap relative to the vertical direction, the location corresponding to the overlap would represent a conflict location.

Figure 2B:
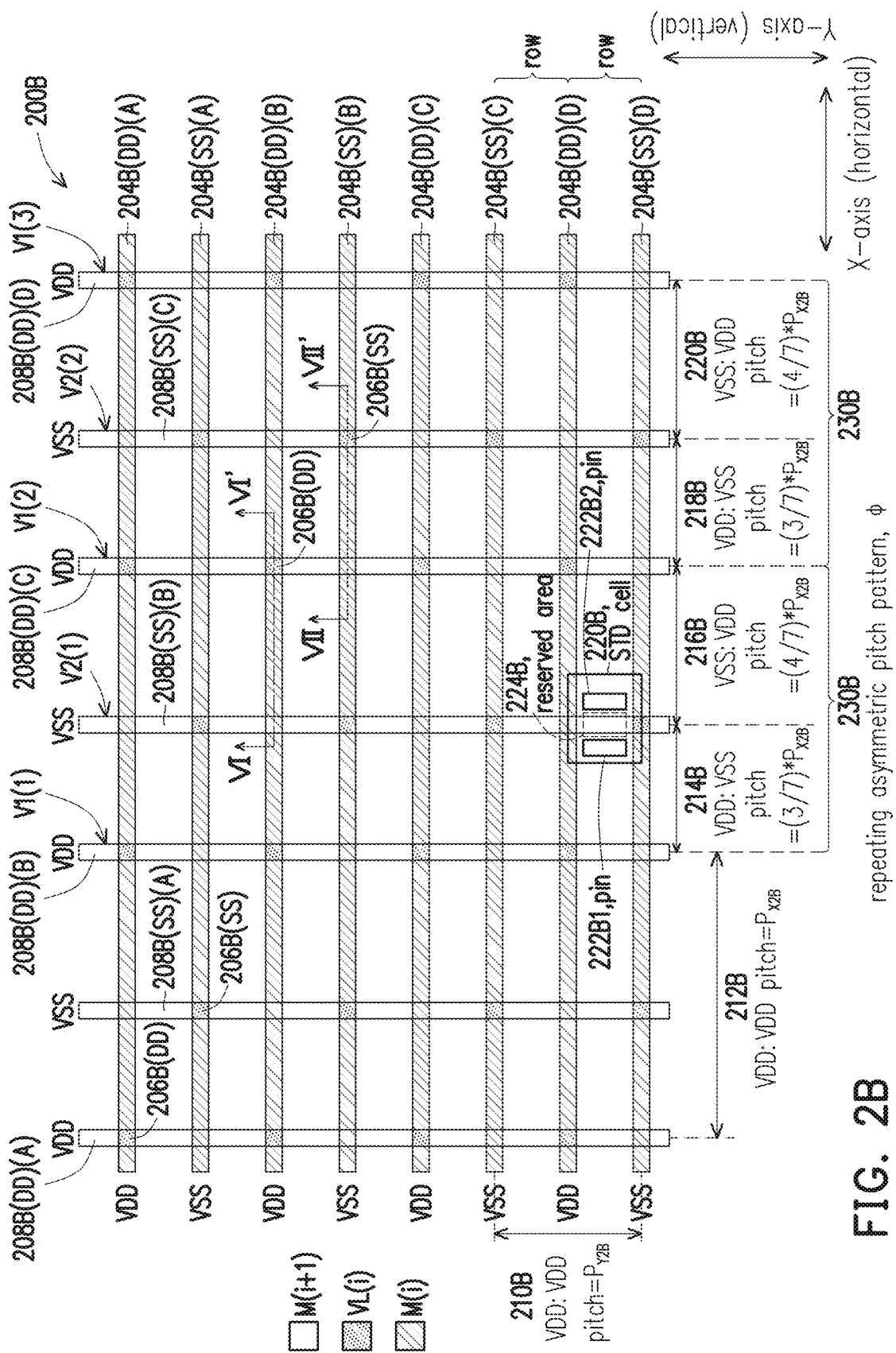
FIG. 2B is a PG layout diagram of an asymmetric arrangement of segment patterns in a power grid, in accordance with at least one embodiment of the present disclosure.

FIG. 2B is a PG layout diagram 200B of an asymmetric arrangement of conductive segments in a power grid, in accordance with at least one embodiment of the present disclosure.

PG layout diagram 200B of FIG. 2B is similar to PG layout diagram 200A of FIG. 2A. For brevity, the discussion of PG layout diagram 200B will focus on differences of PG layout diagram 200B with respect to PG layout diagram 200A. Reference numbers in FIG. 2B which correspond to reference numbers in FIG. 2A include a suffix "B" in FIG. 2B rather than a suffix "A" as in FIG. 2A. For example, reference numbers 204B(DD)(B), 208B(SS)(C) and 220B in FIG. 2B correspond to reference numbers 204A(DD)(B), 208A(SS)(C) and 220A in FIG. 2A. An example of a power grid arrangement based on PG layout diagram 200B is arrangement 104A and/or 104B included semiconductor device 100 of FIG. 1.

PG layout diagram 200B includes the layer M(i), layer M(i+1) over the layer M(i), and the layer VL(i) interposed between layers M(i) and M(i+1). Examples of the layers M(i), VL(i) and M(i+1) are corresponding layers 631, 633 and 635 of FIG. 6 (discussed below) and corresponding layers 731, 733 and 735 of FIG. 7 (discussed below).

As in PG layout diagram 200A, in PG layout diagram 200B, the segment patterns in the layer M(i) have a symmetric arrangement. Relative to the vertical direction, segment patterns 204B(DD)(A)-204B(DD)(D) and 204B(SS)(A)-204B(SS)(D) are separated by distances 210B which represent a pitch $P_{Y2B}$. In some embodiments, the pitch $P_{Y2B}$ is $P_{Y2B} \approx 8.4CPP$. In some embodiments, the pitch $P_{Y2B}$ is a multiple of CPP other than 8.4CPP. In contrast to the symmetric arrangement of the segment patterns in layer M(i) of PG layout diagram 200A of FIG. 2A, the segment patterns in layer M(i+1) of PG layout diagram 200B of FIG. 2B has an asymmetric arrangement.

More particularly, regarding the layer M(i+1) in FIG. 2B, relative to the horizontal direction, segment patterns 208B(DD)(A)-208B(DD)(D) and 208B(SS)(A)-208B(SS)(C) are separated by distances 212B which represent a pitch $P_{X2B}$. FIG. 2B shows distance 212B (which represents the pitch $P_{X2B}$) as $P_{X2B}=28CPP$, which is an integer (28) multiple of CPP. In some embodiments, the pitch $P_{X2B}$ is an integer multiple of CPP other than 28CPP. In general, distance 212B (which represents the pitch $P_{X2B}$) is a positive integer multiple of a base distance λ such that $$P_{X2B}=j*\lambda$$

where j is a positive integer, and where $$\lambda=k*CPP,$$

where k is a positive integer. In FIG. 2B, k=4 such that λ=4CPP, and j=7 such that $P_{X2B}=28CPP=7*\lambda$. As such, in FIG. 2B, distance 212B (which represents the pitch $P_{X2B}$) is both a multiple of 4 and a multiple of CPP. In some embodiments, where a process node has a design rule that standard cells are to be sized as multiples of 4*CPP, the use of k=4 (as in, e.g., FIG. 2B) enhances compatibility with the sizes of the standard cells, and thereby improves a density of the layer M(i+1). Where k is fixed to a single integer, e.g., k=4 as in FIG. 2B, there is said to be a 'pitch restriction' on $P_{X2B}$ because k cannot take a value other than k=4. In some embodiments, k is a positive integer other than k=4. In some embodiments, j is a positive integer other than j=7. In some embodiments, where λ=k*CPP and k is a positive even integer, then a PG layout diagram having an asymmetric arrangement of the segment patterns is used. In some embodiments, where λ=k*CPP and k is a positive even integer, e.g., see FIG. 2A, then a PG layout diagram having a symmetric arrangement of the segment patterns is used.

In some embodiments, $$\lambda=n*CM,$$

where n is a positive integer and CM represents a contacted segment pitch for the layer M(i+1) of a corresponding semiconductor process/technology node, e.g., by which will be fabricated a semiconductor device corresponding to a semiconductor device layout diagram which includes PG layout diagram 200B. In some embodiments, n=6 such that λ=6CM, and j=7 such that $P_{X2B}=42CM=7*\lambda$. As such, in FIG. 2B, distance 212B (which represents the pitch $P_{X2B}$) is both a multiple of 6 and a multiple of CM. In some embodiments, λ=6CM=4CPP. In some embodiments, n is a positive integer other than n=6.

In PG layout diagram 200B, relative to the horizontal direction, the layer M(i+1) has segment patterns 208B(DD)(A)-208B(DD)(D) located between corresponding segment patterns 208B(SS)(A)-208B(SS)(C) such that: a distance 214B separates segment pattern 208B(DD)(A) from segment pattern 208B(SS)(A), segment patterns 208B(DD)(B) from segment pattern 208B(SS)(B), segment pattern 208B(DD)(C) from segment pattern 208B(SS)(C), segment patterns 208B(DD)(B) from segment pattern 208B(SS)(B), and so forth; and a distance 216B separates segment pattern 208B(SS)(A) from segment pattern 208B(DD)(B), segment pattern 208B(SS)(B) from segment pattern 208B(DD)(C), and segment pattern 208B(SS)(C) from segment pattern 208B(DD)(D), and so forth.

Distance 214B represents a first fraction, $F_{2B(1)}$, of $P_{X2B}$ and distance 216B represents a second fraction, $F_{2B(2)}$, of $P_{X2B}$. The first fraction $F_{2B(1)}$ and second fraction $F_{2B(2)}$ sum to $P_{X2B}$ such that $P_{X2B}=F_{2B(1)}+F_{2B(2)}$. In FIG. 2B, the first fraction $F_{2B(1)}$ is $F_{2B(1)}=(3/7)*P_{X2B}$ and the second fraction $F_{2B(2)}$ is $F_{2B(2)}=(4/7)*P_{X2B}$. Recalling that $P_{X2B}=j*\lambda$ and j=7 in FIG. 2B, the first fraction $F_{2B(1)}$ is $F_{2B(1)}=(3/7)*(7*\lambda)=3\lambda$ and the second fraction $F_{2B(2)}$ is $F_{2B(2)}=(4/7)*(7*\lambda)=4\lambda$, where λ is the base distance, discussed above. In some embodiments, the first fraction $F_{2B(1)}$ and second fraction $F_{2B(2)}$ sum to $P_{X2B}$ but are values other than $F_{2B(1)}=(3/7)*P_{X2B}$ and $F_{2B(1)}=(4/7)*P_{X2B}$.

In some embodiments, a PG layout diagram, relative to the horizontal direction, has a substantially asymmetric arrangement of the segment patterns in layer M(i+1) which exhibits a repeating asymmetric pitch pattern referred to as Φ. In PG layout diagram 200B, relative to the horizontal direction, the substantially asymmetric arrangement of the segment patterns in layer M(i+1) exhibits a repeating asymmetric pitch pattern $\Phi_{[V1(1)\sim V2(1)]:[V2(1)\sim V1(2)]}$, which is called out with reference number 230B in FIG. 2B. More particularly, regarding $\Phi_{[V1(1)\sim V2(1)]:[V2(1)\sim V1(2)]}$: V1(1) represents a first given one of segment patterns 208B(DD)(A)-208B(DD)(D), e.g., segment pattern 208B(DD)(B); V2(1) represents a first given one of segment patterns 208B(SS)(A)-208B(aSS)(C), e.g., segment pattern 208B(SS)(B); and V1(2) represents a second given one of segment patterns 208B(DD)(A)-208B(DD)(D), e.g., segment pattern 208B(DD)(C). Accordingly, $\Phi_{[V1(1)\sim V2(1)]:[V2(1)\sim V1(2)]}$ is as follows:

$$\Phi_{[V1(1)\sim V2(1)]:[V2(1)\sim V1(2)]}=F_{2B(1)}:F_{2B(2)}=3\lambda:4\lambda.$$

Recalling that λ=4CPP in FIG. 2B, accordingly $\Phi_{[V1(1)\sim V2(1)]:[V2(1)\sim V1(2)]}=12CPP\lambda:16CPP$ in FIG. 2B.

Also shown in FIG. 2B is a standard cell 220B, which has been placed onto PG layout diagram 200B as a result of a process of designing a more comprehensive layout diagram (not shown) which includes PG layout diagram 200B and one or more standard cells such as standard cell 220B. In particular, standard cell 220B has been placed in the row defined between segment patterns 204B(DD)(D) and 204B(SS)(D). In some embodiments, standard cell 220B is placed in different locations within the row defined between segment patterns 204B(DD)(D) and 204B(SS)(D). In some embodiments, one or more additional instances of standard cell 220B are placed in different locations within the row defined between segment patterns 204B(DD)(D) and 204B(SS)(D). In some embodiments, one or more instances of standard cell 220B are placed in various locations in corresponding one or more rows of PG layout diagram 200B other than the row defined between segment patterns 204B(DD)(D) and 204B(SS)(D). In some embodiments, one or more additional instances of one or more standard cells other than standard cell 220B are placed into rows of PG layout diagram 200B.

In FIG. 2B, standard cell 220B is configured to provide open space in which can be accommodated a portion in the M(i+1) layer of the power grid, namely one of segment patterns 208B(DD)(A)-208B(DD)(D) or 208B(SS)(A)-208B(SS)(C). Standard cell 220B includes pin patterns 222B 1 and 222B2. Like segment patterns 208B(DD)(A)-208B(DD)(D) or 208B(SS)(A)-208B(SS)(C), pin patterns 222B1 and 222B1 also are ones of the segment patterns included in layer M(i+1). Within standard cell 220B, an area 224B is reserved such that no pin pattern is permitted to be located in reserved area 224B. Reserved area 224B is sized, relative to the horizontal direction, to accommodate a portion in the M(I+1) layer of the power grid, namely one of segment patterns 208B(DD)(A)-208B(DD)(D) or 208B(SS)(A)-208B(SS)(C) in layer M(i+1). In FIG. 2B, the location of standard cell 220B accommodates segment pattern 208B(SS)(B). In effect, standard cell 220B straddles segment pattern 208B(SS)(B).

In FIG. 2B, standard cell 220B has been placed at a given location (relative to horizontal direction) within the row defined between segment patterns 204B(DD)(D) and 204B(SS)(D). At the given location, neither pin pattern 222B 1 nor pin pattern 222B2 is co-track aligned with segment pattern 208B(SS)(B). Rather, within standard cell 220B, segment pattern 208B(SS)(B) is located in reserved area 224B, which thereby avoids the creation of a conflict location regarding either of pin patterns 222B 1 or 222B2 and segment pattern 208B(SS)(B).

A benefit of PG layout diagram 200B is a reduction in the number of conflict locations. In some embodiments, where a process node has a design rule that standard cells are to be sized as multiples of 4*CPP, the use of k=4 (as in, e.g., FIG. 2B) enhances compatibility with the sizes of the standard cells, and thereby improves a density of the layer M(i+1). For example, as compared to PG layout diagram 200A, PG layout diagram 200B has fewer conflict locations.

Figure 2C:
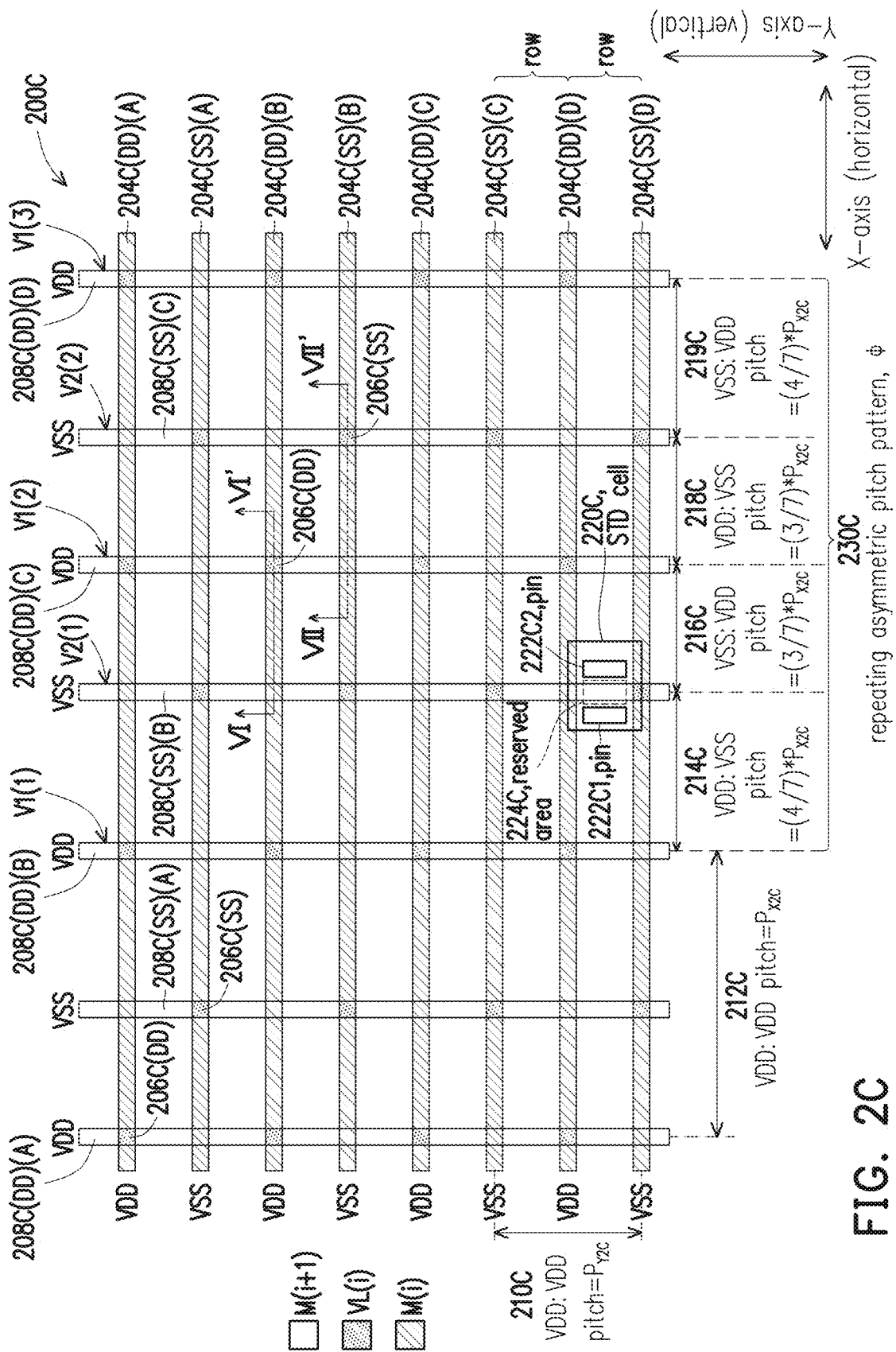
FIG. 2C is a PG layout diagram of an asymmetric arrangement of segment patterns in a power grid, in accordance with at least one embodiment of the present disclosure.

FIG. 2C is a PG layout diagram 200C of an asymmetric arrangement of segment patterns in a power grid, in accordance with at least one embodiment of the present disclosure.

PG layout diagram 200C of FIG. 2C is similar to PG layout diagram 200B of FIG. 2B. For brevity, the discussion of PG layout diagram 200C will focus on differences of PG layout diagram 200C with respect to PG layout diagram 200B. Reference numbers in FIG. 2C which correspond to reference numbers in FIG. 2B include a suffix "C" in FIG. 2C rather than a suffix "B" as in FIG. 2A. For example, reference numbers 204C(DD)(B), 208C(SS)(C) and 220C in FIG. 2C correspond to reference numbers 204B(DD)(C), 208B(SS)(C) and 220B in FIG. 2B. An example of a power grid arrangement based on PG layout diagram 200C is arrangement 104A and/or 104B included semiconductor device 100 of FIG. 1.

PG layout diagram 200C includes the layer M(i), layer M(i+1) over the layer M(i), and the layer VL(i) interposed between layers M(i) and M(i+1). Examples of the layers M(i), VL(i) and M(i+1) are corresponding layers 631, 633 and 635 of FIG. 6 (discussed below) and corresponding layers 731, 733 and 735 of FIG. 7 (discussed below).

As in PG layout diagram 200B, in PG layout diagram 200C, the layer M(i) has a symmetric arrangement of segment patterns. Relative to the vertical direction, segment patterns 204C(DD)(A)-204C(DD)(D) and 204C(SS)(A)-204C(SS)(D) are separated by distances 210C which represent a pitch $P_{Y2C}$. In some embodiments, the pitch $P_{Y2C}$ is $P_{Y2C} \approx 8.4CPP$. In some embodiments, the pitch $P_{Y2C}$ is a multiple of CPP other than 8.4CPP.

Similar to the asymmetric arrangement of the patterns in segment layer M(i+1) of PG layout diagram 200B of FIG. 2B, the layer M(i+1) of PG layout diagram 200C of FIG. 2C has an asymmetric arrangement of segment patterns. As in the asymmetric arrangement of the segment patterns in layer M(i+1) of PG layout diagram 200B, and relative to the horizontal direction, segment patterns 208C(DD)(A)-208C(DD)(D) and 208C(SS)(A)-208C(SS)(C) in the asymmetric arrangement of the segment patterns in layer M(i+1) of PG layout diagram 200C are separated by distances 212C which represent a pitch $P_{X2C}$. FIG. 2C shows distance 212C (which represents the pitch $P_{X2C}$) as $P_{X2C}=28CPP$, which is an integer (28) multiple of CPP. In some embodiments, the pitch $P_{X2C}$ is an integer multiple of CPP other than 28CPP. Similar to layout diagram 200B, distance 212C (which represents the pitch $P_{X2C}$) is $P_{X2C}=j*\lambda$ and $=k*CPP$. In FIG. 2C, k=4 such that $\lambda=4CPP$, and j=7 such that $P_{X2C}=28CPP=7*\lambda$. As such, in FIG. 2C, distance 212C (which represents the pitch $P_{X2C}$) is both a multiple of 4 and a multiple of CPP.

In PG layout diagram 200C, relative to the horizontal direction, the substantially asymmetric arrangement of the segment patterns in layer M(i+1) exhibits a same repeating asymmetric pitch pattern 230C, where pattern 230C is different than repeating asymmetric pitch pattern 230B of PG layout diagram 200B. In PG layout diagram 200C, relative to the horizontal direction, the layer M(i+1) has segment patterns 208C(DD)(A)-208C(DD)(D) located between corresponding segment patterns 208C(SS)(A)-208C(SS)(C) such that: a distance 214C separates segment patterns 208C(DD)(B) from segment pattern 208C(SS)(B), and so forth; a distance 216C separates segment pattern 208C(SS)(B) from segment pattern 208C(DD)(C), and so forth; a distance 218C separates segment pattern 208C(DD)(C) from segment pattern 208C(SS)(C), segment pattern 208C(DD)(A) from segment pattern 208C(SS)(A), and so forth; and a distance 219C separates segment pattern 208C(SS)(C) from segment pattern 208C(DD)(D), segment pattern 208C(SS)(A) from segment pattern 208C(DD)(B), and so forth.

Similar to PG layout diagram 200B, in PG layout diagram 200C, distance 214C represents a first fraction $F_{2C(1)}$ of $P_{X2C}$ and distance 216C represents a second fraction $F_{2C(2)}$ of $P_{X2C}$. Beyond PG layout diagram 200B, in PG layout diagram 200C, distance 218C also represents the second fraction $F_{2C(2)}$, and distance 219C also represents the first fraction $F_{2C(1)}$. Similar to FIG. 2B, in FIG. 2C, the first fraction $F_{2C(1)}$ and second fraction $F_{2C(2)}$ sum to $P_{X2C}$ such that $P_{X2C}=F_{2C(1)}+F_{2C(2)}$.

In FIG. 2C, the first fraction $F_{2C(1)}$ is $F_{2C(1)}=(4/7)*P_{X2C}$ and the second fraction $F_{2C(2)}$ is $F_{2C(2)}=(3/7)*P_{X2C}$. Similar to FIG. 2B, in FIG. 2C, $P_{X2C}=j*\lambda$ and j=7 such that the first fraction $F_{2C(1)}$ is $F_{2C(1)}=(4/7)*(7*\lambda)=4\lambda$ and the second fraction $F_{2C(2)}$ is $F_{2C(2)}=(3/7)*(3*\lambda)=3\lambda$, where $\lambda$ is the base distance, discussed above. In some embodiments, the first fraction $F_{2C(1)}$ and second fraction $F_{2C(2)}$ sum to $P_{X2C}$ but are values other than $F_{2C(1)}=(4/7)*P_{X2C}$ and $F_{2C(1)}=(3/7)*P_{X2C}$.

In PG layout diagram 200C, relative to the horizontal direction, the layer M(i+1) exhibits a repeating asymmetric pitch pattern $\Phi_{[V1(1)\sim V2(1)]:[V2(1)\sim V1(2)]:[V1(2)\sim V2(2)]:[V2(2)\sim V1(3)]}$, where: V1(1) represents a first given one of segment patterns 208C(DD)(A)-208C(DD)(D), e.g., segment pattern 208C(DD)(B); V2(1) represents a first given one of segment patterns 208C(SS)(A)-208C(SS)(C), e.g., segment pattern 208C(SS)(B); V1(2) represents a second given one of segment patterns 208C(DD)(A)-208C(DD)(D), e.g., segment pattern 208C(DD)(C); V2(2) represents a second given one of segment patterns 208C(SS)(A)-208C(SS)(C), e.g., segment pattern 208C(SS)(C); and V1(3) represents a third given one of segment patterns 208C(DD)(A)-208C(DD)(D), e.g., segment pattern 208C(DD)(D). Accordingly, $\Phi_{[V1(1)\sim V2(1)]:[V2(1)\sim V1(2)]:[V1(2)\sim V2(2)]:[V2(2)\sim V1(3)]}$ is as follows:

$$\Phi_{[V1(1)\sim V2(1)]:[V2(1)\sim V1(2)]:[V1(2)\sim V2(2)]:[V2(2)\sim V1(3)]}=$$
$$F_{2C(1)}:F_{2C(2)}:F_{2C(2)}:F_{2C(1)}=4\lambda:3\lambda:3\lambda:4\lambda.$$

Recalling that $\lambda$=4CPP in FIG. 2C, accordingly $\Phi_{[V1(1)\sim V2(1)]:[V2(1)\sim V1(2)]:[V1(2)\sim V2(2)]:[V2(2)\sim V1(3)]}$=16CPP: 12CPP$\lambda$:12CPP$\lambda$:16CPP in FIG. 2C.

Also shown in FIG. 2C is a standard cell 220C, which has been placed onto PG layout diagram 200C as a result of a process of designing a more comprehensive layout diagram (not shown) which includes PG layout diagram 200C and one or more standard cells such as standard cell 220C. In particular, standard cell 220C has been placed in the row defined between segment patterns 204C(DD)(D) and 204C(SS)(D). In some embodiments, standard cell 220C is placed in different locations within the row defined between segment patterns 204C(DD)(D) and 204C(SS)(D). In some embodiments, one or more additional instances of standard cell 220C are placed in different locations within the row defined between segment patterns 204C(DD)(D) and 204C(SS)(D). In some embodiments, one or more instances of standard cell 220C are placed in various locations in corresponding one or more rows of PG layout diagram 200C other than the row defined between segment patterns 204C(DD)(D) and 204C(SS)(D). In some embodiments, one or more additional instances of one or more standard cells other than standard cell 220C are placed into rows of PG layout diagram 200C.

In FIG. 2C, a standard cell 220C has been placed onto PG layout diagram 200C as a result of a process of designing a more comprehensive layout diagram (not shown) which includes PG layout diagram 200C and one or more standard cells such as standard cell 220C. Standard cell 220C is configured to provide open space in which can be accommodated a portion in the M(i+1) layer of the power grid, namely one of segment patterns 208C(DD)(A)-208C(DD)(D) or 208C(SS)(A)-208C(SS)(C). Standard cell 220C includes pin patterns 222C1 and 222C2. Like segment patterns 208C(DD)(A)-208C(DD)(D) or 208C(SS)(A)-208C(SS)(C), pin patterns 222C1 and 222C2 also are also ones of the segment patterns included in layer M(i+1). Within standard cell 220C, an area 224C is reserved such that no pin pattern of standard cell 220C is permitted to be located in reserved area 224C. Reserved area 224C is sized, relative to the horizontal direction, to accommodate a portion in the M(i+1) layer of the power grid, namely one of segment patterns 208C(DD)(A)-208C(DD)(D) or 208C(SS)(A)-208C(SS)(C) in layer M(i+1). In FIG. 2C, the location of standard cell 220C accommodates segment pattern 208C(SS)(B). In effect, standard cell 220C straddles segment pattern 208C(SS)(B).

In FIG. 2C, standard cell 220C has been placed at a location within the row defined between segment patterns 204C(DD)(D) and 204C(SS)(D) which avoids a conflict location regarding pin 222C and any of segment patterns 208C(DD)(A)-208C(DD)(D) and 208C(SS)(A)-208C(SS)(C).

A benefit of PG layout diagram 200C is a reduction in the number of conflict locations. In some embodiments, where a process node has a design rule that standard cells are to be sized as multiples of 4*CPP, the use of k=4 (as in, e.g., FIG. 2B) enhances compatibility with the sizes of the standard cells, and thereby improves a density of the layer M(i+1). For example, as compared to PG layout diagram 200A, PG layout diagram 200C has fewer conflict locations.

Figure 3:
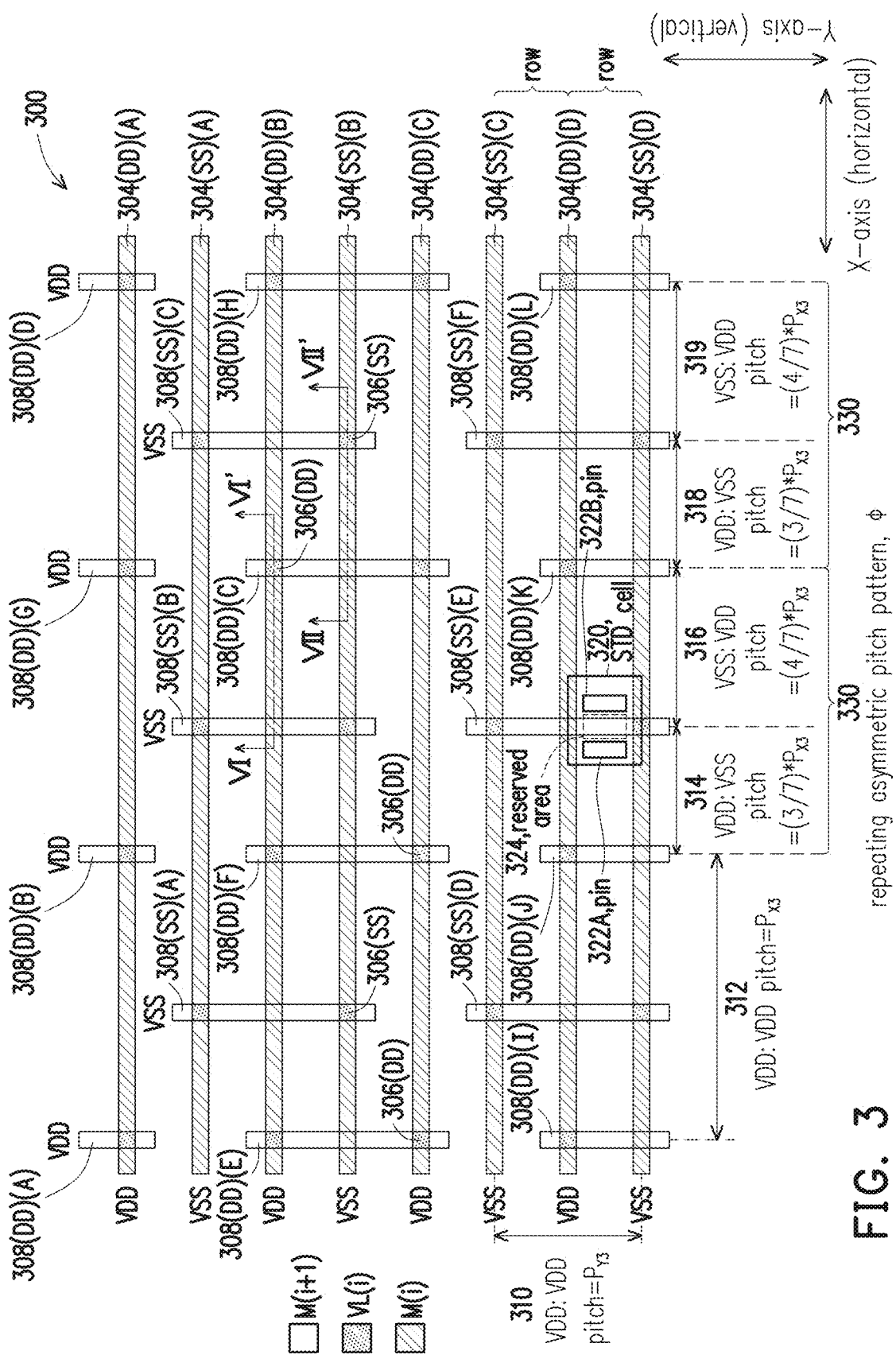
FIG. 3 is a PG layout diagram of an asymmetric arrangement of segment patterns in a power grid, in accordance with at least one embodiment of the present disclosure.

FIG. 3 is a PG layout diagram 300 of an asymmetric arrangement of segment patterns in a power grid, in accordance with at least one embodiment of the present disclosure.

PG layout diagram 300 of FIG. 3 is similar to PG layout diagram 200B of FIG. 2B. For brevity, the discussion of PG layout diagram 300 will focus on differences of PG layout diagram 300 with respect to PG layout diagram 200B. Reference numbers in FIG. 3 which correspond to reference numbers in FIG. 2B include a prefix "3" rather than a prefix "2" as in FIG. 2B, and omit the suffix "B" used in FIG. 2B. For example, reference numbers 304(DD)(B), 306(SS) and 320 in FIG. 3 correspond to reference numbers 204B(DD)(C), 206B(SS) and 220B in FIG. 2B. An example of a power grid arrangement based on PG layout diagram 300 is arrangement 104A and/or 104B included semiconductor device 100 of FIG. 1.

In FIG. 3, the segment patterns in layer M(i+1) include segment patterns 308(DD)(A)-308(DD)(L) and 308(SS)(A)-308(SS)(F), which are greater in number than the number of segment patterns 208A(DD)(A)-208A(DD)(D) and 208A(SS)(A)-208A(SS)(C) of FIG. 2B. In terms of height (see discussion below), segment patterns 308(DD)(A)-308(DD)(L) and 308(SS)(A)-308(SS)(F) of FIG. 3 represent long pillars.

More particularly, in terms of height, each of segment patterns 308(DD)(A)-308(DD)(L) and 308(SS)(A)-308(SS)(F) and the like has a length, $L_{LP}$, less than or equal to a predetermined length, $L_{LIMIT}$, where $L_{LP} \leq L_{LIMIT}$. In some embodiments, $L_{LIMIT}$ is substantially equal to, albeit without being greater than, the Blech length, $L_{Blech}$, where $L_{LIMIT} \approx L_{Blech}$ AND $L_{LIMIT} \leq L_{Blech}$. It is noted that $L_{Blech}$ represents a length of conductor below which substantially no electromigration (EM) occurs. In some embodiments, $L_{LIMIT}$ is a length other than Blech length, $L_{Blech}$.

A benefit of PG layout diagram 300 is reduced susceptibility to EM problems in layer M(i+1) because, in some embodiments, segment patterns 308(DD)(A)-308(DD)(L) and 308(SS)(A)-308(SS)(F) and the like have a length, $L_{LP}$, where $L_{LP} \leq L_{Blech}$, and are regarded as long pillars. By contrast, segment patterns 208A(DD)(A)-208A(DD)(D) and 208A(SS)(A)-208A(SS)(C) of FIG. 2B are stripes/lines, where a stripe/line has a length $L_{STRIPE}$, which is greater than Blech length, $L_{Blech}$, namely $L_{Blech} < L_{STRIPE}$. For example, as compared to PG layout diagrams 200A or 200B, PG layout diagram 300 is more resistant to EM problems in the segments of layer M(i+1).

Another benefit of PG layout diagram 300 is a reduction in the number of conflict locations. For example, as compared to PG layout diagram 200B, PG layout diagram 300 has fewer conflict locations (again, a conflict location is one in which a strap pattern is located and which a pin pattern possibly could be located) is avoided. More particularly, sizes in the vertical direction of segment patterns 308(DD)(A)-308(DD)(L) and 308(SS)(A)-308(SS)(F) in layer M(i+1) of PG layout diagram 300 are smaller than sizes in the vertical direction of, e.g., segment patterns segment patterns 208B(DD)(A)-208B(DD)(D) and 208B(SS)(A)-208B(SS)(C) in layer M(i+1) of PG layout diagram 200B, such that a total area represented by segment patterns 308(DD)(A)-308(DD)(L) and 308(SS)(A)-308(SS)(F) is smaller than a total area represented by segment patterns 208B(DD)(A)-208B(DD)(D) and 208B(SS)(A)-208B(SS)(C). A number of potential conflict locations is proportional to an area of segment patterns in layer M(i+1). The total area represented by segment patterns 308(DD)(A)-308(DD)(L) and 308(SS)(A)-308(SS)(F) is smaller than the total area represented by segment patterns 208B(DD)(A)-208B(DD)(D) and 208B(SS)(A)-208B(SS)(C), hence PG layout diagram 300 has fewer potential conflict locations as compared to PG layout diagram 200B.

Figure 4:
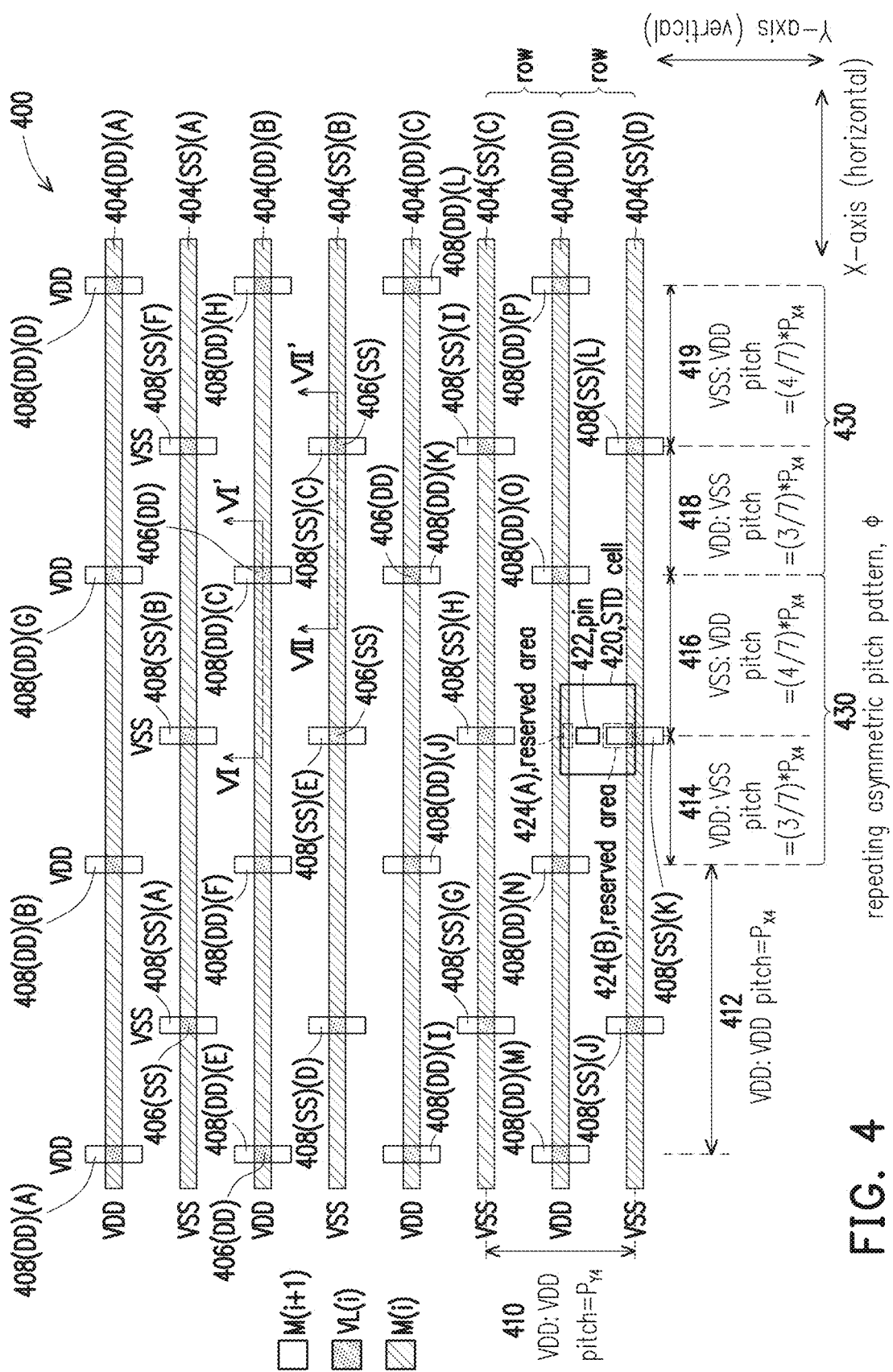
FIG. 4 is a PG layout diagram of an asymmetric arrangement of segment patterns in a power grid, in accordance with at least one embodiment of the present disclosure.

FIG. 4 is a PG layout diagram 400 of an asymmetric arrangement of segment patterns in a power grid, in accordance with at least one embodiment of the present disclosure.

PG layout diagram 400 of FIG. 4 is similar to PG layout diagram 300 of FIG. 3. For brevity, the discussion of PG layout diagram 400 will focus on differences of PG layout diagram 400 with respect to PG layout diagram 300. Reference numbers in FIG. 4 which correspond to reference numbers in FIG. 2B include a prefix "4" rather than a prefix "3" as in FIG. 3. For example, reference numbers 404(DD)(B), 406(SS) and 420 in FIG. 4 correspond to reference numbers 304(DD)(C), 306(SS) and 320 in FIG. 2B. An example of a power grid arrangement based on PG layout diagram 400 is arrangement 104A and/or 104B included semiconductor device 100 of FIG. 1.

In FIG. 4, the segment patterns in layer M(i+1) include segment patterns 408(DD)(A)-408(DD)(P) and 408(SS)(A)-408(SS)(L), which is greater number than segment patterns 308(DD)(A)-308(DD)(L) and 308(SS)(A)-308(SS)(F) of FIG. 3. Whereas segment patterns 308(DD)(A)-308(DD)(L) and 308(SS)(A)-308(SS)(F) of FIG. 3 represent long pillars, segment patterns 408(DD)(A)-408(DD)(P) and 408(SS)(A)-408(SS)(L) of FIG. 4 represent short pillars. In some embodiments, a short pillar has a length, $L_{SP}$, which is substantially shorter than a length $L_LP$ of a long pillar.

In terms of height, each of segment patterns 408(DD)(A)-408(DD)(L) and 408(SS)(A)-408(SS)(F) and the like has a length, L4, which is approximately ⅓ of distance 410, where distance 410 represents a pitch $P_{Y4}$. In some embodiments, L4 is substantially equal to, albeit without being smaller than, a minimum height of a segment pattern in layer M(i+1) of a corresponding semiconductor process/technology node, e.g., by which will be fabricated a semiconductor device corresponding to a semiconductor device layout diagram which includes PG layout diagram 400.

Within standard cell 420, areas 424(A) and 424(B) are reserved. In an area which is reserved (reserved area), no pin pattern can be located in the reserved area. Hence, in either of reserved areas 424(A) and 424(B), no pin pattern can be located. Each of reserved areas 424(A) and 424(B) is sized, relative to the horizontal and vertical directions, to accommodate one of segment patterns 408(DD)(A)-408(DD)(P) and 408(SS)(A)-408(SS)(L).

In FIG. 4, in particular, the location of standard cell 420 accommodates segment pattern 408B(SS)(K). Though pin pattern 422 is co-track aligned with segment pattern 408(SS)(K), a conflict location (again, a conflict location is one in which a strap pattern is located and which a pin pattern possibly could be located) is avoided regarding pin pattern 422 and segment pattern 408(SS)(K) because segment pattern 408(SS)(K) is located in reserved area 424(B), and the reserved status of area 424(B) ensures that no pin will be located in area 424(B).

A benefit of PG layout diagram 400 is a reduction in the number of conflict locations. For example, as compared to PG layout diagrams 200A, 200B, 200C or 300, PG layout diagram 300 has fewer potential conflict locations. More particularly, sizes in the vertical direction of segment patterns 408(DD)(A)-408(DD)(P) and 408(SS)(A)-408(SS)(L) in layer M(i+1) of PG layout diagram 400 are smaller than sizes in the vertical direction of, e.g., segment patterns 308(DD)(A)-308(DD)(L) and 308(SS)(A)-308(SS)(F) in layer M(i+1) of PG layout diagram 300, such that a total area represented by segment patterns 408(DD)(A)-408(DD)(P) and 408(SS)(A)-408(SS)(L) is smaller than a total area represented by segment patterns 308(DD)(A)-308(DD)(L) and 308(SS)(A)-308(SS)(F). A number of potential conflict locations is proportional to an area of segment patterns in layer M(i+1). The total area represented by segment patterns 408(DD)(A)-408(DD)(P) and 408(SS)(A)-408(SS)(L) is smaller than a total area represented by segment patterns 308(DD)(A)-308(DD)(L) and 308(SS)(A)-308(SS)(F), hence PG layout diagram 400 has fewer potential conflict locations as compared to PG layout diagram 300.

Figure 5:
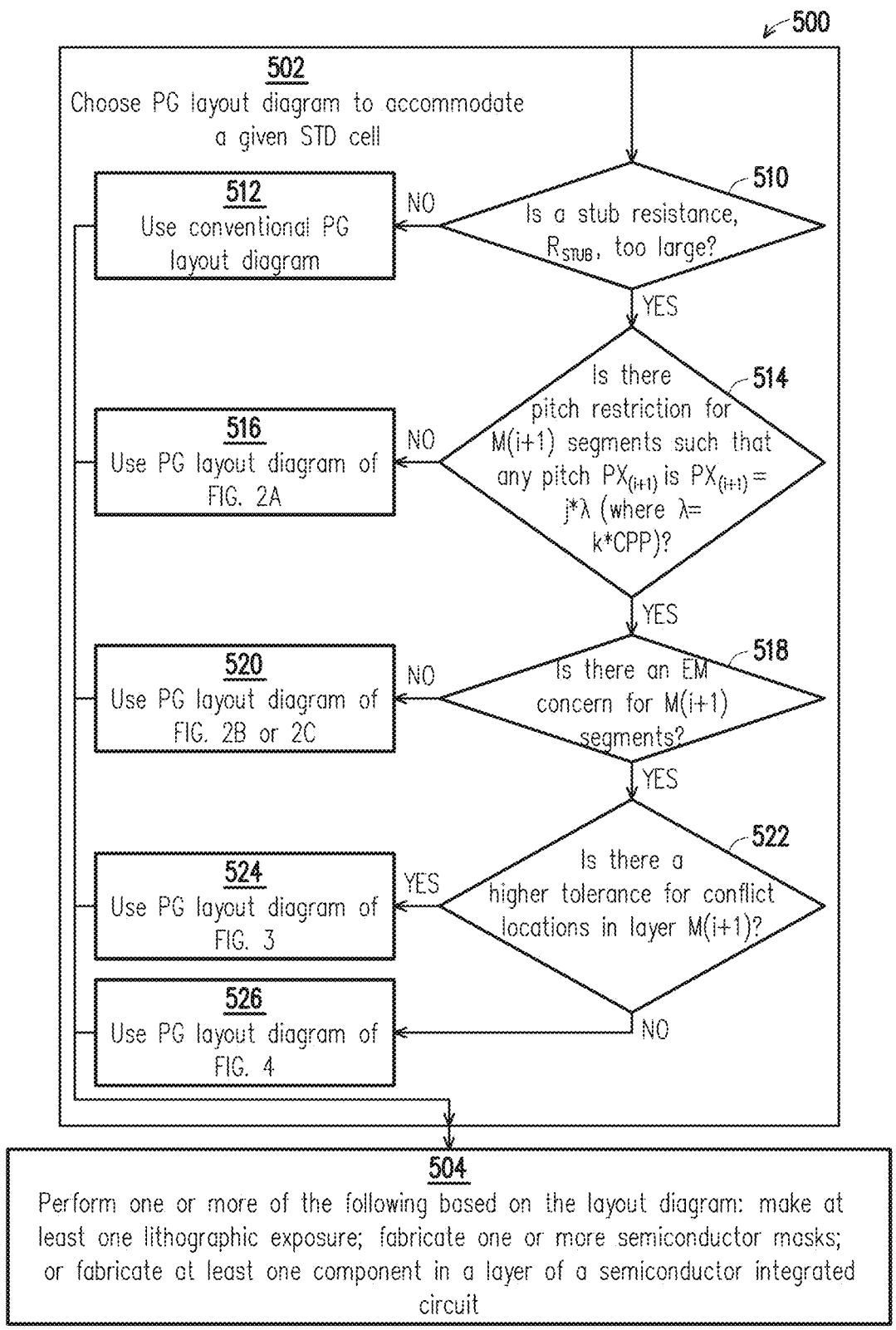
FIG. 5 is a flowchart of a method of choosing a PG layout diagram, in accordance with some embodiments.

FIG. 5 is a flowchart of a method 500 of choosing a PG layout diagram, in accordance with some embodiments.

Method 500 is implementable, for example, using EDA system 900 (FIG. 9, discussed below), in accordance with some embodiments.

In FIG. 5, method 500 includes blocks 502-504. At block 502, a PG layout diagram is chosen by taking into consideration aspects which accommodate a standard cell. Block 502 includes blocks 510-526. Examples of PG layout diagrams which may be chosen according to block 502 include the PG layout diagrams of FIGS. 2A-2C, 3 and 4, discussed above, or the like.

Within block 502, at block 510, it is determined if the stub resistance, $R_{STUB}$, is too large. The stub resistance $R_{STUB}$ and the threshold resistance $R_{THRESH}$ are discussed above in the context of FIG. 2A. In some embodiments, at block 510, it is determined if the stub resistance $R_{STUB}$ is greater than a threshold resistance such that $R_{STUB} > R_{THRESH}$. If the outcome of the decision at block 510 is no (stub resistance $R_{STUB}$ is NOT too large), then flow proceeds to block 512. At block 512, a conventional PG layout diagram is used. From block 512, flow exits block 502. If the outcome of the decision at block 510 is yes (stub resistance $R_{STUB}$ is too large), then flow proceeds to block 514.

At block 514, it is determined if there is pitch restriction for segments in the layer M(i+1) such that any pitch $P_{X(i+1)}$ is an integer multiple of a base distance λ. More particularly, it is determined if $P_{X(i+1)} = j*\lambda$, where j is a positive integer, λ=k*CPP, and k is a positive integer. Pitch restriction is discussed above in the context of FIG. 2B. If the outcome of the decision at block 514 is no (pitch not restricted), then flow proceeds to block 516. At block 516, PG layout diagram 200A of FIG. 2A, or the like is used. From block 516, flow exits block 502. If the outcome of the decision at block 514 is yes (pitch is restricted), then flow proceeds to block 518.

At block 518, it is determined if there is an electromigration (EM) concern for segments in the layer M(i+1). In some embodiments, the determination of an whether there is an electromigration issue is based on test data, details of the grain structure for the conductors under consideration, the metal deposition process used to form the conductors under consideration, or the like. EM is discussed above in the context of FIG. 3. If the outcome of the decision at block 518 is no (there is little, if an, EM concern), then flow proceeds to block 520. At block 520, PG layout diagram 200B of FIG. 2B or PG layout diagram 200C of FIG. 2C, or the like is used. From block 520, flow exits block 502. If the outcome of the decision at block 518 is yes (there is EM concern), then flow proceeds to block 522.

At block 522, it is determined if there is a higher tolerance (discussed below) for conflict locations in layer M(i+1). Conflict-locations in layer M(i+1) are discussed, e.g., in the context of FIG. 2A. In some embodiments, there is a higher tolerance for conflict locations if a lower number of unconflicted locations is acceptable. If the outcome of the decision at block 522 is yes (there is a higher tolerance for conflict locations), then flow proceeds to block 524. At block 524, PG layout diagram 300 of FIG. 3, or the like is used. From block 524, flow exits block 502. If the outcome of the decision at block 522 is no (there is NOT a higher tolerance for conflict locations), then flow proceeds to block 526. At block 526, PG layout diagram 400 of FIG. 4, or the like is used. From block 526, flow exits block 502.

From block 502 of FIG. 5, flow proceeds to block 504. At block 504, based on a layout diagram which includes the PG layout diagram chosen in block 502, one or more of the following is performed based on the layout diagram: one or more lithographic exposures are made; one or more semiconductor masks are fabricated; or at least one component in a layer of a semiconductor integrated circuit is fabricated. See discussion below of FIG. 10.

Figure 6:
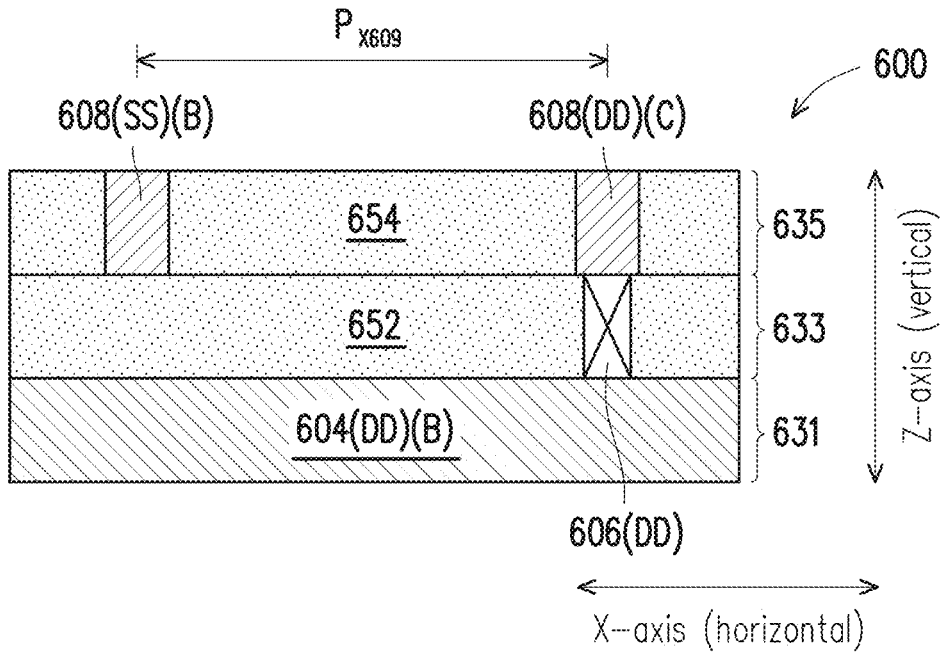
FIG. 6 is a cross-section of a PG arrangement of a semiconductor device, in accordance with some embodiments.

FIG. 6 is a cross-section of a power grid (PG) arrangement 600 of a semiconductor device, in accordance with some embodiments.

PG arrangement 600 is an example of a power grid arrangement of a semiconductor device which is fabricated based on a PG layout diagram such as the PG layout diagrams of FIG. 2A, 2B, 2C or 3, or the like. As such, power grid arrangement 600 is an example of power grid arrangement 104A and/or 104B of semiconductor device 100 of FIG. 1. A cross-section line VI-VI' in each of FIGS. 2A, 2B, 2C and 3 shows the corresponding relationships to FIG. 6.

PG arrangement 600 includes a layer 631, 633 and 635. Layer 633 is formed over layer 631. Layer 635 is formed over layer 633. In some embodiments, layer 633 is formed directly on layer 631. In some embodiments, layer 635 is formed directly on layer 633. Layer 631 corresponds to layer M(i) of metallization and layer 635 corresponds to layer M(i+1) of metallization, where i is an integer and i≥0. In some embodiments, the $i^{th}$ layer is the first layer of metallization, in which case i=0 or i=1 depending upon the numbering convention of the corresponding design rules. Layer 633 corresponds to layer VL(i) of contacts. In some embodiments, the contacts in layer 633 include vias.

More particularly, in FIG. 6, layer 631 includes a segment 604(DD)(B). For example, segment 604(DD)(B) corresponds to segment pattern 204B(DD) in FIG. 2B. Layer 635 includes segments 608(SS)(B) and 608(DD)(C), and an insulator 654. For example, segments 608(SS)(B) and 608(DD)(C) correspond to segment patterns 208B(SS)(B) and 208B(DD)(C) in FIG. 2B. Layer 633 includes a via 606(DD) and an insulating material 652. For example, via 606(DD) corresponds to via pattern 206B(DD) in FIG. 2B located at the intersection of segment pattern 204B(DD)(B) in layer M(i) and segment pattern 208(DD)(C) in layer M(i+1). In some embodiments, insulators 652 and 654 are formed of one or more dielectric materials.

In PG arrangement 600, a pitch between segments 608(SS)(B) and 608(DD)(C) is indicated as $PX_{609}$. For example, pitch $PX_{609}$ corresponds to the pitch between segment patterns 208B(SS)(B) and 208B(DD)(C) in FIG. 2B.

It is noted that an alternate version of PG arrangement 600 corresponds to cross-section line VI-VI' shown in FIG. 4. The alternate version of PG arrangement 600 does not include segment 608(SS)(B). As such, the alternate version of PG arrangement 600 is an example of a power grid arrangement of a semiconductor device which is fabricated based on a PG layout diagram such as the PG layout diagram of FIG. 4, or the like.

Figure 7:
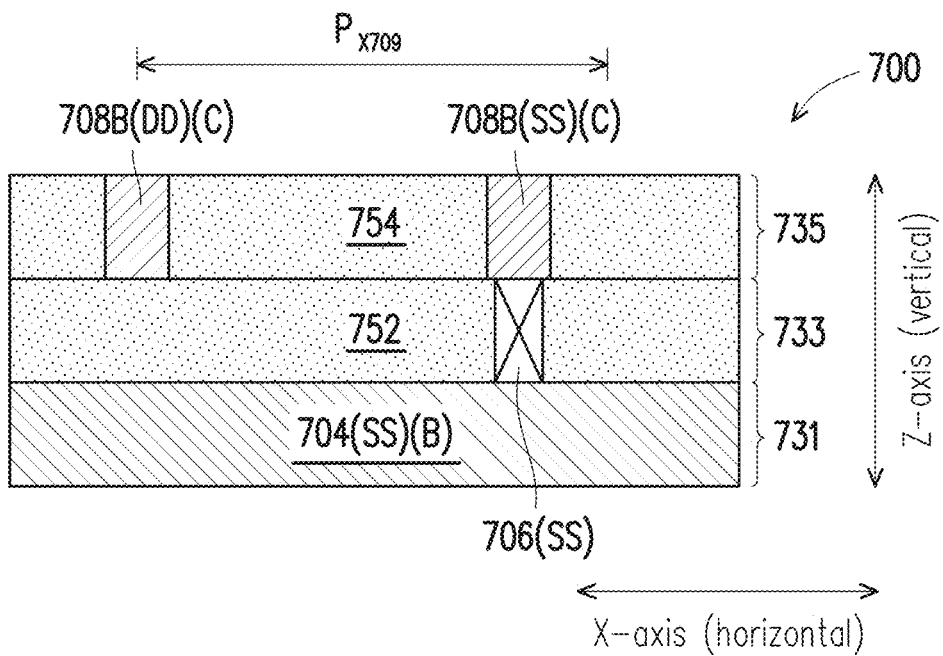
FIG. 7 is a cross-section of a PG arrangement of a semiconductor device, in accordance with some embodiments.

FIG. 7 is a cross-section of a power grid (PG) arrangement 700 of a semiconductor device, in accordance with some embodiments.

PG arrangement 700 is an example of a power grid arrangement of a semiconductor device which is fabricated based on a PG layout diagram such as the PG layout diagrams of FIG. 2A, 2B, 2C or 3, or the like. As such, power grid arrangement 700 is an example of power grid arrangement 104A and/or 104B of semiconductor device 100 of FIG. 1. A cross-section line VII-VII' in each of FIGS. 2A, 2B, 2C and 3 shows the corresponding relationships to FIG. 7.

PG arrangement 700 includes a layer 731, 733 and 735. Layer 733 is formed over layer 731. Layer 735 is formed over layer 733. In some embodiments, layer 733 is formed directly on layer 731. In some embodiments, layer 735 is formed directly on layer 733. Layer 731 corresponds to layer M(i) of metallization and layer 735 corresponds to layer M(i+1) of metallization, where i is an integer and i≥0. In some embodiments, the $i^{th}$ layer is the first layer of metallization, in which case i=0 or i=1 depending upon the numbering convention of the corresponding design rules. Layer 733 corresponds to layer VL(i) of contacts. In some embodiments, the contacts in layer 733 include vias.

More particularly, in FIG. 7, layer 731 includes a segment 704(DD)(B). For example, segment 704(SS)(B) corresponds to segment pattern 204B(SS) in FIG. 2B. Layer 735 includes segments 708(DD)(C) and 708(SS)(C), and an insulator 754. For example, segments 708(DD)(C) and 708(SS)(C) correspond to segment patterns 208B(DD)(C) and 208B(SS)(C) in FIG. 2B. Layer 733 includes a via 706(SS) and an insulating material 752. For example, via 706(SS) corresponds to via pattern 206B(SS) in FIG. 2B located at the intersection of segment pattern 204B(SS)(B) in layer M(i) and segment pattern 208(SS)(C) in layer M(i+1). In some embodiments, insulators 752 and 754 are formed of one or more dielectric materials.

In PG arrangement 700, a pitch between segments 708(DD)(C) and 708(SS)(C) is indicated as $PX_{709}$. For example, pitch $PX_{709}$ corresponds to the pitch between segment patterns 208B(DD)(C) and 208B(SS)(C) in FIG. 2B.

It is noted that an alternate version of PG arrangement 700 corresponds to cross-section line VII-VII' shown in FIG. 4. The alternate version of PG arrangement 700 does not include segment 708(SS)(B). As such, the alternate version of PG arrangement 700 is an example of a power grid arrangement of a semiconductor device which is fabricated based on a PG layout diagram such as the PG layout diagram of FIG. 4, or the like.

Figure 8:
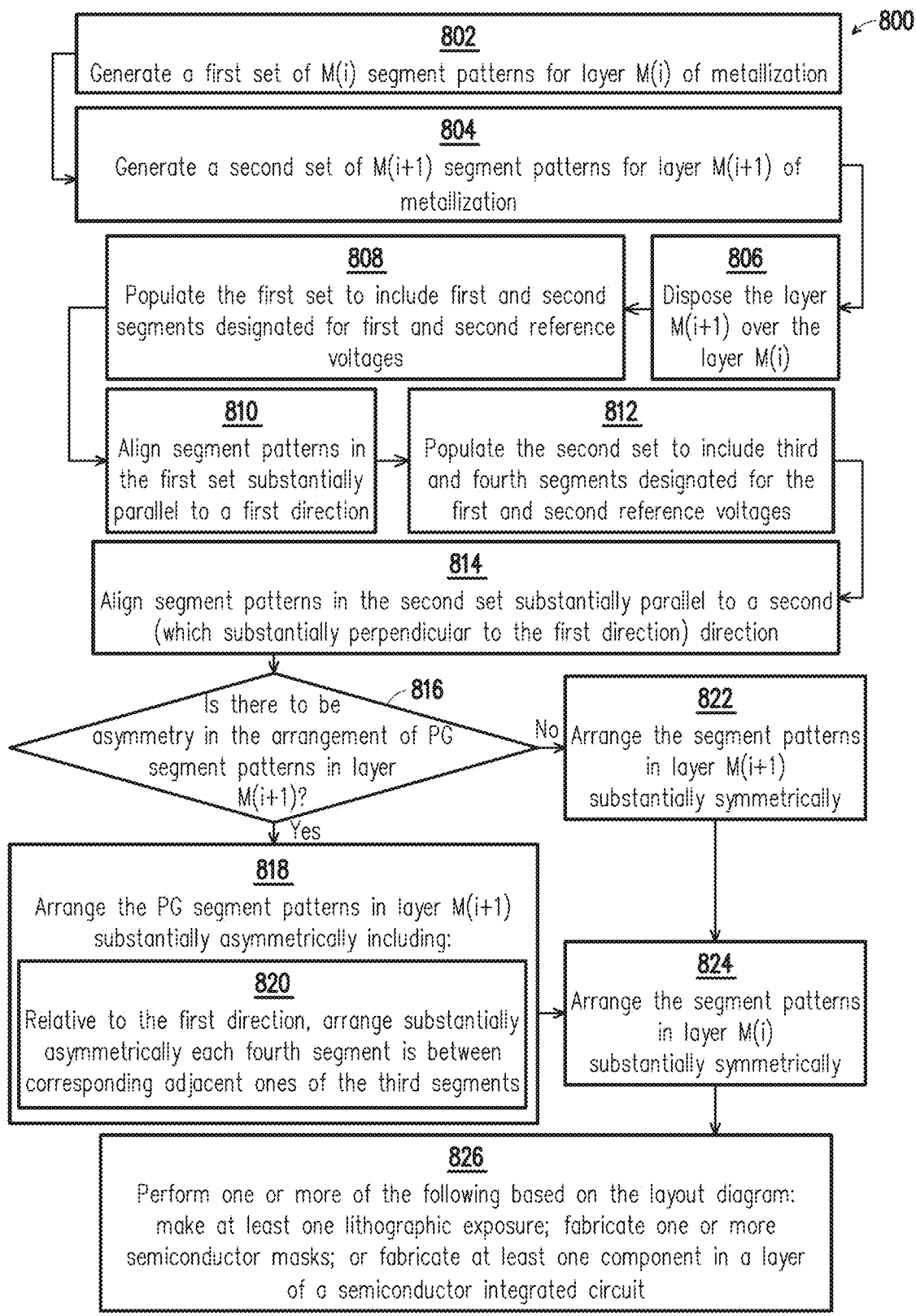
FIG. 8 is a flowchart of a method of generating an asymmetric arrangement of segment patterns in a PG layout diagram, in accordance with some embodiments.

FIG. 8 is a flowchart of a method 800 of generating an asymmetric arrangement of segment patterns in a PG layout diagram, in accordance with some embodiments.

Method 800 is implementable, for example, using EDA system 900 (FIG. 9, discussed below), in accordance with some embodiments.

In FIG. 8, method 800 includes blocks 802-820. At block 820, a first set of segment patterns for layer M(i) of metallization are generated. In some embodiments, the metallization of layer M(i) is metallization. Examples of segment patterns for layer M(i) are described in the context of the PG layout diagrams of FIGS. 2A-2C, 3 and 4, discussed above. More particularly, examples of segment patterns for layer M(i) include segment patterns 204B(DD)(A)-204B(DD)(D) and 204B(SS)(A) 204B(SS)(D) in layout diagram 200B of FIG. 2B, and 204C(DD)(A)-204C(DD)(D) and 204C(SS)(A) 204C(SS)(D) in layout diagram 200C of FIG. 2C. From block 802, flow proceeds to block 804.

At block 804, a second set of segment patterns for layer M(i+1) of metallization are generated. In some embodiments, the metallization of layer M(i+1) is metallization. Examples of segment patterns for layer M(i+1) are described in the context of the PG layout diagrams of FIGS. 2A-2C, 3 and 4, discussed above. More particularly, examples of segment patterns for layer M(i+1) include segment patterns 208B(DD)(A)-208B(DD)(D) and 208B(SS)(A) 208B(SS)(D) in layout diagram 200B of FIG. 2B, and 208C(DD)(A)-208C(DD)(D) and 208C(SS)(A) 208C(SS)(D) in layout diagram 200C of FIG. 2C. From block 804, flow proceeds to block 806.

At block 806, the layer M(i+1) is disposed over the layer M(i). Examples of layer M(i+1) being disposed over layer M(i) are shown in FIGS. 6-7. From block 806, flow proceeds to block 808.

At block 808, the first set is populated to include first and second segments designated for first and second reference voltages. In the example context of the layout diagrams of FIGS. 2B-2C, examples of the first segments are segment patterns 204B(DD)(A)-204B(DD)(D) of FIG. 2B and segment patterns 204C(DD)(A)-204C(DD)(D) of FIG. 2C, whereas examples of the second segments are segment patterns 204B(SS)(A) 204B(SS)(D) of FIG. 2B ad segment patterns 204C(SS)(A) 204C(SS)(D) of FIG. 2C are. In the example PG layout diagrams of FIGS. 2A-2C, 3 and 4, the first reference voltage is VDD and the second reference voltage is VSS. From block 808, flow proceeds to block 810.

At block 810, segment patterns in the first set are aligned substantially parallel to a first direction. In the example PG layout diagrams of FIGS. 2A-2C, 3 and 4, the first direction is the horizontal direction. From block 810, flow proceeds to block 812.

At block 812, the second set is populated to include third and fourth segments designated for the first and second reference voltages. In the example context of the layout diagrams of FIGS. 2B-2C, examples of the third segments are segment patterns 208B(DD)(A)-208B(DD)(D) of FIG. 2B and segment patterns 208C(DD)(A)-208C(DD)(D) of FIG. 2C, whereas examples of the second segments are segment patterns 208B(SS)(A) 208B(SS)(D) of FIG. 2B ad segment patterns 208C(SS)(A) 208C(SS)(D) of FIG. 2C are. From block 812, flow proceeds to block 814.

At block 814, segment patterns in the second set are aligned substantially parallel to a second direction, the second direction being substantially perpendicular to the first direction. In the example PG layout diagrams of FIGS. 2A-2C, 3 and 4, the second direction is the vertical direction. From block 814, flow proceeds to block 816.

At block 816, a decision is made whether there is to be asymmetry in the arrangement of PG segment patterns in layer M(i+1). If the outcome of the decision in block 818 is yes (the segment patterns in layer M(i+1) are to be asymmetric), then flow proceeds to block 818. At block 818, the PG segment patterns in M(i+1) layer are arranged substantially asymmetrically. Block 818 includes block 820. At block 820, relative to the first direction, each fourth segment is arranged substantially asymmetrically between corresponding adjacent ones of the third segments. In each of the example PG layout diagrams of FIGS. 2B-2C, 3 and 4, the arrangement of PG segment patterns in a layer M(i+1) is asymmetric. From block 820, flow exits block 818. From block 818 flow proceeds to block 824 (discussed below). If the outcome of the decision in block 818 is no (the PG segment patterns in layer M(i+1) are to be symmetric), then flow proceeds to block 820. At block 820, the PG segment patterns in M(i+1) layer are arranged substantially symmetrically. In the example PG layout diagram of FIG. 2A, the arrangement of PG segment patterns in layer M(i+1) is symmetric. From block 822, flow proceeds to block 824.

At block 824, the segment patterns in layer M(i) are arranged substantially symmetrically. In each of the example PG layout diagrams of FIGS. 2A-2C, 3 and 4, the segment patterns in layer M(i) are symmetric.

In some embodiments, method 800 further includes blocks 830-832 (not shown). In some embodiments, rather than flow proceeding from block 824 to block 826, flow proceeds from block 824 to block 830 (again, not shown). At block 830, a third set of contact patterns, e.g., via patterns, for the layer VL(i) is generated. Examples of via patterns for layer VL(i) are described in the context of the PG layout diagrams of FIGS. 2A-2C, 3 and 4, discussed above. More particularly, examples of via patterns for layer VL(i) include via patterns 206B(DD) and 206B(SS) in layout diagram 200B of FIG. 2B, and 206C(DD) and 206C(SS) in layout diagram 200C of FIG. 2C. From block 830, flow proceeds to block 832 (again, not shown).

At block 832, the via patterns are substantially correspondingly aligned with intersections of segment patterns in layer M(i) and corresponding segment patterns in layer M(i+1). Referring to the example of FIG. 2B, via patterns 206B(DD) are disposed between the layers M(i) and M(i+1) and located at intersections of segment patterns 204B(DD)(A)-204B(DD)(D) in layer M(i) and segment patterns 208B(DD)(A)-208B(DD)(D) in layer M(i+1), whereas via patterns 206B(SS) are located at intersections of segment patterns 204B(SS)(A)-204B(SS)(D) in layer M(i) and segment patterns 208B(SS)(A)-208B(SS)(C) in layer M(i+1). From block 832, flow proceeds to block 826.

Figure 9:
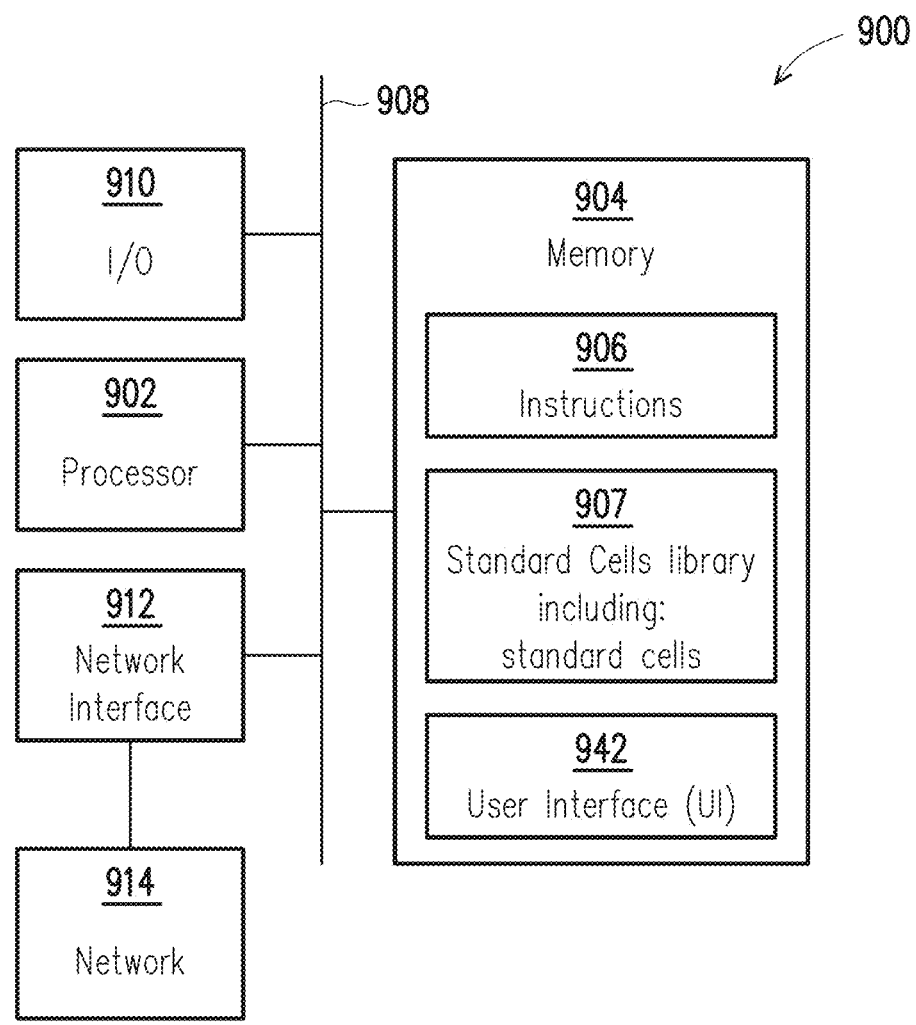
FIG. 9 is a block diagram of an electronic design automation (EDA) system, in accordance with some embodiments.

FIG. 9 is a block diagram of an electronic design automation (EDA) system 900, in accordance with some embodiments.

In some embodiments, EDA system 900 includes an APR system. Methods described herein of generating PG layout diagrams, in accordance with one or more embodiments, are implementable, for example, using EDA system 900, in accordance with some embodiments.

In some embodiments, EDA system 900 is a general purpose computing device including a hardware processor 902 and a non-transitory, computer-readable storage medium 904. Storage medium 904, amongst other things, is encoded with, i.e., stores, computer program code 906, i.e., a set of executable instructions. Execution of instructions 906 by hardware processor 902 represents (at least in part) an EDA tool which implements a portion or all of, e.g., the methods described herein in accordance with one or more (hereinafter, the noted processes and/or methods).

Processor 902 is electrically coupled to computer-readable storage medium 904 via a bus 908. Processor 902 is also electrically coupled to an I/O interface 910 by bus 908. A network interface 912 is also electrically connected to processor 902 via bus 908. Network interface 912 is connected to a network 914, so that processor 902 and computer-readable storage medium 904 are capable of connecting to external elements via network 914. Processor 902 is configured to execute computer program code 906 encoded in computer-readable storage medium 904 in order to cause system 900 to be usable for performing a portion or all of the noted processes and/or methods. In one or more embodiments, processor 902 is a central processing unit (CPU), a multi-processor, a distributed processing system, an application specific integrated circuit (ASIC), and/or a suitable processing unit.

In one or more embodiments, computer-readable storage medium 904 is an electronic, magnetic, optical, electromagnetic, infrared, and/or a semiconductor system (or apparatus or device). For example, computer-readable storage medium 904 includes a semiconductor or solid-state memory, a magnetic tape, a removable computer diskette, a random access memory (RAM), a read-only memory (ROM), a rigid magnetic disk, and/or an optical disk. In one or more embodiments using optical disks, computer-readable storage medium 904 includes a compact disk-read only memory (CD-ROM), a compact disk-read/write (CD-R/W), and/or a digital video disc (DVD).

In one or more embodiments, storage medium 904 stores computer program code 906 configured to cause system 900 (where such execution represents (at least in part) the EDA tool) to be usable for performing a portion or all of the noted processes and/or methods. In one or more embodiments, storage medium 904 also stores information which facilitates performing a portion or all of the noted processes and/or methods. In one or more embodiments, storage medium 904 stores library 907 of standard cells including such standard cells as disclosed herein.

EDA system 900 includes I/O interface 910. I/O interface 910 is coupled to external circuitry. In one or more embodiments, I/O interface 910 includes a keyboard, keypad, mouse, trackball, trackpad, touchscreen, and/or cursor direction keys for communicating information and commands to processor 902.

EDA system 900 also includes network interface 912 coupled to processor 902. Network interface 912 allows system 900 to communicate with network 914, to which one or more other computer systems are connected. Network interface 912 includes wireless network interfaces such as BLUETOOTH, WIFI, WIMAX, GPRS, or WCDMA; or wired network interfaces such as ETHERNET, USB, or IEEE-1364. In one or more embodiments, a portion or all of noted processes and/or methods, is implemented in two or more systems 900.

System 900 is configured to receive information through I/O interface 910. The information received through I/O interface 910 includes one or more of instructions, data, design rules, libraries of standard cells, and/or other parameters for processing by processor 902. The information is transferred to processor 902 via bus 908. EDA system 900 is configured to receive information related to a UI through I/O interface 910. The information is stored in computer-readable medium 904 as user interface (UI) 942.

In some embodiments, a portion or all of the noted processes and/or methods is implemented as a standalone software application for execution by a processor. In some embodiments, a portion or all of the noted processes and/or methods is implemented as a software application that is a part of an additional software application. In some embodiments, a portion or all of the noted processes and/or methods is implemented as a plug-in to a software application. In some embodiments, at least one of the noted processes and/or methods is implemented as a software application that is a portion of an EDA tool. In some embodiments, a portion or all of the noted processes and/or methods is implemented as a software application that is used by EDA system 900. In some embodiments, a layout diagram which includes standard cells is generated using a tool such as VIRTUOSO® available from CADENCE DESIGN SYSTEMS, Inc., or another suitable layout generating tool.

In some embodiments, the processes are realized as functions of a program stored in a non-transitory computer readable recording medium. Examples of a non-transitory computer readable recording medium include, but are not limited to, external/removable and/or internal/built-in storage or memory unit, e.g., one or more of an optical disk, such as a DVD, a magnetic disk, such as a hard disk, a semiconductor memory, such as a ROM, a RAM, a memory card, and the like.

Figure 10:
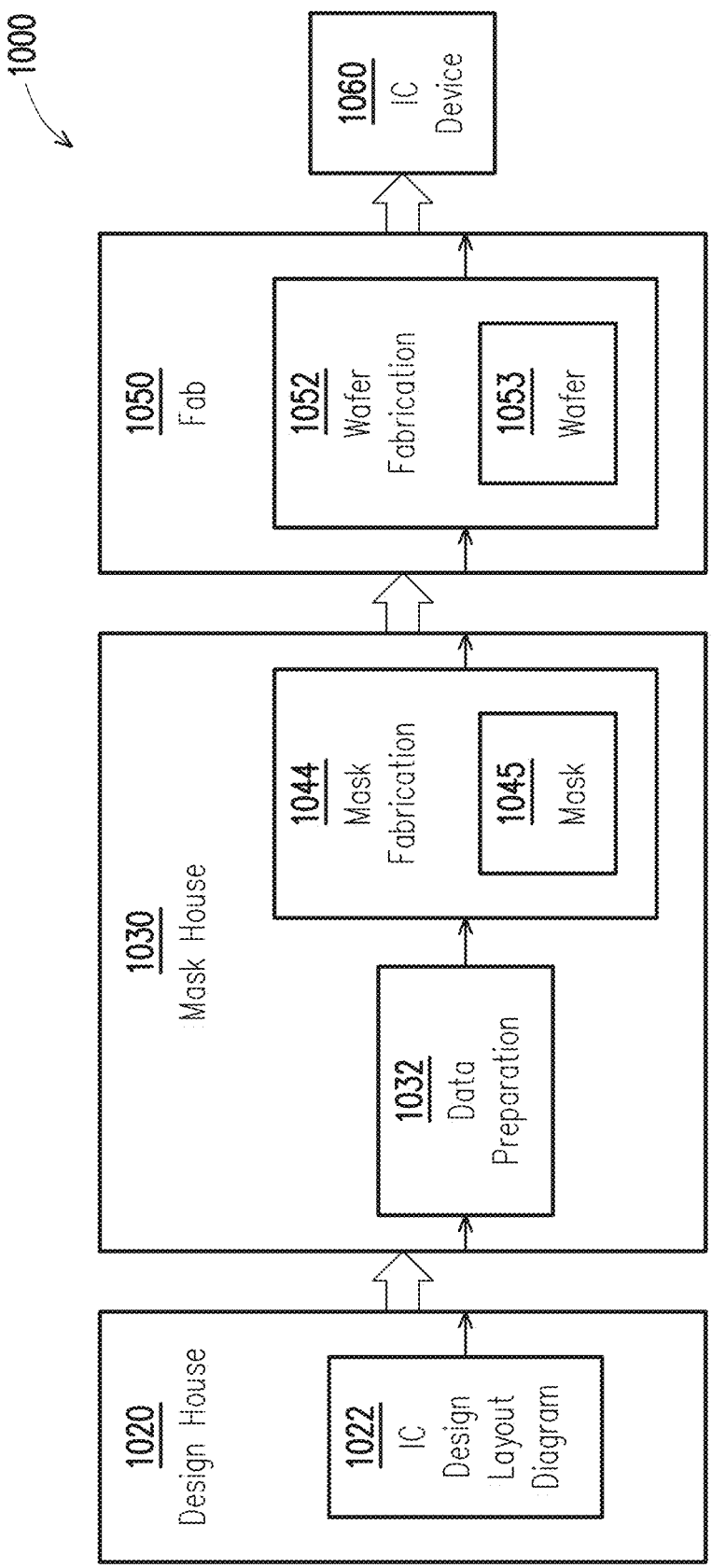
FIG. 10 is a block diagram of an integrated circuit (IC) manufacturing system, and an IC manufacturing flow associated therewith, in accordance with some embodiments.

FIG. 10 is a block diagram of an integrated circuit (IC) manufacturing system 1000, and an IC manufacturing flow associated therewith, in accordance with some embodiments. In some embodiments, based on a layout diagram, at least one of (A) one or more semiconductor masks or (B) at least one component in a layer of a semiconductor integrated circuit is fabricated using manufacturing system 1000.

In FIG. 10, IC manufacturing system 1000 includes entities, such as a design house 1020, a mask house 1030, and an IC manufacturer/fabricator ("fab") 1050, that interact with one another in the design, development, and manufacturing cycles and/or services related to manufacturing an IC device 1060. The entities in system 1000 are connected by a communications network. In some embodiments, the communications network is a single network. In some embodiments, the communications network is a variety of different networks, such as an intranet and the Internet. The communications network includes wired and/or wireless communication channels. Each entity interacts with one or more of the other entities and provides services to and/or receives services from one or more of the other entities. In some embodiments, two or more of design house 1020, mask house 1030, and IC fab 1050 is owned by a single larger company. In some embodiments, two or more of design house 1020, mask house 1030, and IC fab 1050 coexist in a common facility and use common resources.

Design house (or design team) 1020 generates an IC design layout diagram 1022. IC design layout diagram 1022 includes various geometrical patterns designed for an IC device 1060. The geometrical patterns correspond to patterns of metal, oxide, or semiconductor layers that make up the various components of IC device 1060 to be fabricated. The various layers combine to form various IC features. For example, a portion of IC design layout diagram 1022 includes various IC features, such as an active region, gate electrode, source and drain, metal lines or vias of an interlayer interconnection, and openings for bonding pads, to be formed in a semiconductor substrate (such as a silicon wafer) and various material layers disposed on the semiconductor substrate. Design house 1020 implements a proper design procedure to form IC design layout diagram 1022.

The design procedure includes one or more of logic design, physical design or place and route. IC design layout diagram 1022 is presented in one or more data files having information of the geometrical patterns. For example, IC design layout diagram 1022 can be expressed in a GDSII file format or DFII file format.

Mask house 1030 includes data preparation 1032 and mask fabrication 1044. Mask house 1030 uses IC design layout diagram 1022 to manufacture one or more masks 1045 to be used for fabricating the various layers of IC device 1060 according to IC design layout diagram 1022. Mask house 1030 performs mask data preparation 1032, where IC design layout diagram 1022 is translated into a representative data file ("RDF"). Mask data preparation 1032 provides the RDF to mask fabrication 1044. Mask fabrication 1044 includes a mask writer. A mask writer converts the RDF to an image on a substrate, such as a mask (reticle) 1045 or a semiconductor wafer 1053. The design layout diagram 1022 is manipulated by mask data preparation 1032 to comply with particular characteristics of the mask writer and/or requirements of IC fab 1050. In FIG. 10, mask data preparation 1032 and mask fabrication 1044 are illustrated as separate elements. In some embodiments, mask data preparation 1032 and mask fabrication 1044 can be collectively referred to as mask data preparation.

In some embodiments, mask data preparation 1032 includes optical proximity correction (OPC) which uses lithography enhancement techniques to compensate for image errors, such as those that can arise from diffraction, interference, other process effects and the like. OPC adjusts IC design layout diagram 1022. In some embodiments, mask data preparation 1032 includes further resolution enhancement techniques (RET), such as off-axis illumination, sub-resolution assist features, phase-shifting masks, other suitable techniques, and the like or combinations thereof. In some embodiments, inverse lithography technology (ILT) is also used, which treats OPC as an inverse imaging problem.

In some embodiments, mask data preparation 1032 includes a mask rule checker (MRC) that checks the IC design layout diagram 1022 that has undergone processes in OPC with a set of mask creation rules which contain certain geometric and/or connectivity restrictions to ensure sufficient margins, to account for variability in semiconductor manufacturing processes, and the like. In some embodiments, the MRC modifies the IC design layout diagram 1022 to compensate for limitations during mask fabrication 1044, which may undo part of the modifications performed by OPC in order to meet mask creation rules.

In some embodiments, mask data preparation 1032 includes lithography process checking (LPC) that simulates processing that will be implemented by IC fab 1050 to fabricate IC device 1060. LPC simulates this processing based on IC design layout diagram 1022 to create a simulated manufactured device, such as IC device 1060. The processing parameters in LPC simulation can include parameters associated with various processes of the IC manufacturing cycle, parameters associated with tools used for manufacturing the IC, and/or other aspects of the manufacturing process. LPC takes into account various factors, such as aerial image contrast, depth of focus ("DOF"), mask error enhancement factor ("MEEF"), other suitable factors, and the like or combinations thereof. In some embodiments, after a simulated manufactured device has been created by LPC, if the simulated device is not close enough in shape to satisfy design rules, OPC and/or MRC are be repeated to further refine IC design layout diagram 1022.

It should be understood that the above description of mask data preparation 1032 has been simplified for the purposes of clarity. In some embodiments, data preparation 1032 includes additional features such as a logic operation (LOP) to modify the IC design layout diagram 1022 according to manufacturing rules. Additionally, the processes applied to IC design layout diagram 1022 during data preparation 1032 may be executed in a variety of different orders.

After mask data preparation 1032 and during mask fabrication 1044, a mask 1045 or a group of masks 1045 are fabricated based on the modified IC design layout diagram 1022. In some embodiments, mask fabrication 1044 includes performing one or more lithographic exposures based on IC design layout diagram 1022. In some embodiments, an electron-beam (e-beam) or a mechanism of multiple e-beams is used to form a pattern on a mask (photomask or reticle) 1045 based on the modified IC design layout diagram 1022. Mask 1045 can be formed in various technologies. In some embodiments, mask 1045 is formed using binary technology. In some embodiments, a mask pattern includes opaque regions and transparent regions. A radiation beam, such as an ultraviolet (UV) beam, used to expose the image sensitive material layer (e.g., photoresist) which has been coated on a wafer, is blocked by the opaque region and transmits through the transparent regions. In one example, a binary mask version of mask 1045 includes a transparent substrate (e.g., fused quartz) and an opaque material (e.g., chromium) coated in the opaque regions of the binary mask. In another example, mask 1045 is formed using a phase shift technology. In a phase shift mask (PSM) version of mask 1045, various features in the pattern formed on the phase shift mask are configured to have proper phase difference to enhance the resolution and imaging quality. In various examples, the phase shift mask can be attenuated PSM or alternating PSM. The mask(s) generated by mask fabrication 1044 is used in a variety of processes. For example, such a mask(s) is used in an ion implantation process to form various doped regions in semiconductor wafer 1053, in an etching process to form various etching regions in semiconductor wafer 1053, and/or in other suitable processes.

IC fab 1050 includes wafer fabrication 1052. IC fab 1050 is an IC fabrication business that includes one or more manufacturing facilities for the fabrication of a variety of different IC products. In some embodiments, IC Fab 1050 is a semiconductor foundry. For example, there may be a manufacturing facility for the front end fabrication of a plurality of IC products (front-end-of-line (FEOL) fabrication), while a second manufacturing facility may provide the back end fabrication for the interconnection and packaging of the IC products (back-end-of-line (BEOL) fabrication), and a third manufacturing facility may provide other services for the foundry business.

IC fab 1050 uses mask(s) 1045 fabricated by mask house 1030 to fabricate IC device 1060. Thus, IC fab 1050 at least indirectly uses IC design layout diagram 1022 to fabricate IC device 1060. In some embodiments, semiconductor wafer 1053 is fabricated by IC fab 1050 using mask(s) 1045 to form IC device 1060. In some embodiments, the IC fabrication includes performing one or more lithographic exposures based at least indirectly on IC design layout diagram 1022. Semiconductor wafer 1053 includes a silicon substrate or other proper substrate having material layers formed thereon. Semiconductor wafer 1053 further includes one or more of various doped regions, dielectric features, multi-level interconnects, and the like (formed at subsequent manufacturing steps).

Details regarding an integrated circuit (IC) manufacturing system (e.g., system 1000 of FIG. 10), and an IC manufacturing flow associated therewith are found, e.g., in U.S. Pat. No. 9,256,709, granted Feb. 9, 2016, U.S. Pre-Grant Publication No. 20150278429, published Oct. 1, 2015, U.S. Pre-Grant Publication No. 20140040838, published Feb. 6, 2014, and U.S. Pat. No. 7,260,442, granted Aug. 21, 2007, the entireties of each of which are hereby incorporated by reference.

In an embodiment, a semiconductor device includes: a power grid (PG) arrangement including: a conductive layer M(i) including segments which are conductive, where i is an integer and i≥0; and a conductive layer M(i+1) over the conductive layer M(i), the conductive layer M(i+1) including segments which are conductive; the segments in the conductive M(i) layer including first segments designated for a first reference voltage and second segments designated for a second reference voltage, the first and second segments being interspersed and substantially parallel to a first direction; and the segments in the conductive layer M(i+1) including third segments designated for the first reference voltage and fourth segments designated for the second reference voltage; the third and fourth segments being interspersed and substantially parallel to a second direction, the second direction being perpendicular to the first direction; and wherein the segments in the conductive layer M(i+1) are arranged substantially asymmetrically such that each fourth segment is located, relative to the first direction, substantially asymmetrically between corresponding adjacent ones of the third segments.

In some embodiments, a method of generating a layout diagram of a power grid (PG) for a semiconductor device (the layout diagram being stored on a non-transitory computer-readable medium) includes: populating a first set of segment patterns, for a conductive layer M(i), where i is an integer and i≥0, to include interspersed first and second segment patterns designated for corresponding first and second reference voltages; aligning the first and second segment patterns substantially parallel to a first direction; populating a second set of segment patterns, for a conductive layer M(i+1), to include interspersed third and fourth segment patterns designated corresponding for the first and second reference voltages; aligning the third and fourth segments substantially parallel to a second direction, the second direction being perpendicular to the first direction; for any given one of third segments and any given one of the fourth segments which is adjacent to the given one of third segments, setting a distance therebetween which is both a multiple of four and a multiple of CPP, where CPP represents a contacted polysilicon pitch of a corresponding semiconductor process/technology; and arranging, relative to the first direction, each fourth segment substantially asymmetrically between corresponding adjacent ones of the third segments.

In an embodiment, a semiconductor device includes: a power grid (PG) arrangement including a conductive layer M(i) including segments which are conductive, where i is an integer and i≥0; and a conductive layer M(i+1) over the conductive layer M(i), the conductive layer M(i+1) including segments which are conductive; the segments in the conductive layer M(i) including first segments designated for a first reference voltage and second segments designated for a second reference voltage, the first and second segments being interspersed and substantially parallel to a first direction; the segments in the conductive layer M(i+1) including third segments designated for the first reference voltage and fourth segments designated for the second reference voltage; the third and fourth segments being interspersed and substantially parallel to a second direction, the second direction being perpendicular to the first direction; the third segments having a first pitch; the fourth segments having the first pitch; and wherein portions of each of the first and second segments with a length substantially equal to the first pitch have a corresponding stub resistance; and the first pitch is sized to keep the stub resistance below a threshold resistance.

It will be readily seen by one of ordinary skill in the art that one or more of the disclosed embodiments fulfill one or more of the advantages set forth above. After reading the foregoing specification, one of ordinary skill will be able to affect various changes, substitutions of equivalents and various other embodiments as broadly disclosed herein. It is therefore intended that the protection granted hereon be limited only by the definition contained in the appended claims and equivalents thereof.

What is claimed is:

1. A semiconductor device comprising:
   a power grid (PG) arrangement including:
      a conductive layer M(i) including segments which are conductive, where i is an integer and i≥0; and
      a conductive layer M(i+1) over the conductive layer M(i), the conductive layer M(i+1) including segments which are conductive;
   the segments in the conductive layer M(i) including:
      first segments designated for a first reference voltage and second segments designated for a second reference voltage, the first and second segments being interspersed and substantially parallel to a first direction; and
   the segments in the conductive layer M(i+1) including:
      third segments designated for the first reference voltage and fourth segments designated for the second reference voltage; the third and fourth segments being interspersed and substantially parallel to a second direction, the second direction being perpendicular to the first direction; and
   wherein:
      the segments in the conductive layer M(i+1) are arranged substantially asymmetrically such that each fourth segment is located, relative to the first direction, substantially asymmetrically between corresponding adjacent ones of the third segments.

2. The semiconductor device of claim 1, wherein:
   the substantially asymmetric arrangement of the segments in the conductive layer M(i+1), relative to the first direction, has fourth segments located between corresponding adjacent ones of the third segments and exhibits a same repeating asymmetric pitch pattern.

3. The semiconductor device of claim 2, wherein:
   the conductive layer M(i+1) has $\Phi_{[V1(1)\sim V2(1)]:[V2(1)\sim V1(2)]}$ as the repeating asymmetric pitch pattern, where:
      V1(1) represents a first given one of third segments;
      V2(1) represents a first given one of the fourth segments; and
      V1(2) represents a second given one of third segments;
   the first and second given ones of the third segments are correspondingly left and right adjacent to the first given one of the fourth segments; and
   $\Phi_{[V1(1)\sim V2(1)]:[V2(1)\sim V1(2)]}$ is as follows:

$$\Phi_{[V1(1)\sim V2(1)]:[V2(1)\sim V1(2)]}=3\lambda:4\lambda,$$

where:

λ represents a base distance such that $$\lambda = k*CPP,$$

where:
k is a positive integer; and
CPP represents a contacted polysilicon pitch of a corresponding semiconductor process/technology.

4. The semiconductor device of claim 3, wherein:
k=4 such that $\Phi_{(V2L \sim V1C):(V1C \sim V2R)}$ is as follows:

$$\Phi_{(V2L \sim V1C):(V1C \sim V2R)} = 12CPP:16CPP.$$

5. The semiconductor device of claim 2, wherein:
the conductive layer M(i+1) has $\Phi_{[V1(1) \sim V2(1)]:[V2(1) \sim V1(2)]:[V1(2) \sim V2(2)]:[V2(2) \sim V1(3)]}$ as the repeating asymmetric pitch pattern, where:
V1(1) represents a first given one of third segments;
V2(1) represents a first given one of the fourth segments;
V1(2) represents a second given one of third segments;
V2(2) represents a second given one of the fourth segments; and
V1(3) represents a third given one of third segments;
the first and second given ones of the third segments are correspondingly left and right adjacent to the first given one of the fourth segments;
the first and second given ones of the fourth segments are correspondingly left and right adjacent to the second given one of the third segments;
the second and third given ones of the third segments are correspondingly left and right adjacent to the second given one of the fourth segments; and
$\Phi_{[V1(1) \sim V2(1)]:[V2(1) \sim V1(2)]:[V1(2) \sim V2(2)]:[V2(2) \sim V1(3)]}$ is as follows:

$$\Phi_{[V1(1) \sim V2(1)]:[V2(1) \sim V1(2)]:[V1(2) \sim V2(2)]:[V2(2) \sim V1(3)]} = 4\lambda:3\lambda:3\lambda:4\lambda;$$

where:
λ represents a base distance such that $$\lambda = k*CPP;$$

where:
k being a positive integer; and
CPP representing a contacted polysilicon pitch of a corresponding semiconductor process/technology.

6. The semiconductor device of claim 5, wherein:
k=4 such that $\Phi_{[V1(1) \sim V2(1)]:[V2(1) \sim V1(2)]:[V1(2) \sim V2(2)]:[V2(2) \sim V1(3)]}$ is as follows:

$$\Phi_{[V1(1) \sim V2(1)]:[V2(1) \sim V1(2)]:[V1(2) \sim V2(2)]:[V2(2) \sim V1(3)]} = 16CPP:12CPP:12CPP:16CPP.$$

7. The semiconductor device of claim 1, wherein:
the third and fourth segments are short pillars, a length of each short pillar segment being approximately a minimum length for a corresponding semiconductor process/technology; and
the first and second segments are stripes.

8. The semiconductor device of claim 1, wherein:
for any given one of third segments and any given one of the fourth segments which is adjacent to the given one of third segments, a distance between the given one of third segments and the given one of the fourth segments is a multiple of a base distance λ such that $$\lambda = k*CPP;$$

k being a positive integer; and
CPP representing a contacted polysilicon pitch of a corresponding semiconductor process/technology.

9. A method of generating a layout diagram of a power grid (PG) for a semiconductor device, the layout diagram being stored on a non-transitory computer-readable medium, the method comprising:
populating a first set of segment patterns, for a conductive layer M(i), where i is an integer and i≥0, to include:
interspersed first and second segment patterns designated for corresponding first and second reference voltages;
aligning the first and second segment patterns substantially parallel to a first direction;
populating a second set of segment patterns, for a conductive layer M(i+1) of, to include:
interspersed third and fourth segment patterns designated corresponding for the first and second reference voltages;
aligning the third and fourth segments substantially parallel to a second direction, the second direction being perpendicular to the first direction;
for any given one of third segments and any given one of the fourth segments which is adjacent to the given one of third segments, setting a distance therebetween which is both a multiple of four and a multiple of CPP, where CPP represents a contacted polysilicon pitch of a corresponding semiconductor process/technology; and
arranging, relative to the first direction, each fourth segment substantially asymmetrically between corresponding adjacent ones of the third segments.

10. The method of claim 9, further comprising:
uniformly spacing the fourth segment between the third segments so that, relative to the first direction, locations of fourth segments between corresponding adjacent ones of the third segments exhibits a same repeating asymmetric pitch pattern.

11. The method of claim 10, further comprising:
setting $\angle_{[V1(1) \sim V2(1)]:[V2(1) \sim V1(2)]}$ as the repeating asymmetric pitch pattern for the conductive layer M(i+1), where:
V1(1) represents a first given one of third segments;
V2(1) represents a first given one of the fourth segments; and
V1(2) represents a second given one of third segments;
the first and second given ones of the third segments being correspondingly left and right adjacent to the first given one of the fourth segments; and
wherein $\Phi_{[V1(1) \sim V2(1)]:[V2(1) \sim V1(2)]}$ is as follows:

$$\Phi_{[V1(1) \sim V2(1)]:[V2(1) \sim V1(2)]} = 3\lambda:4\lambda,$$

where:
λ represents a base distance such that $$\lambda = k*CPP,$$

where:
k is a positive integer; and
CPP represents a contacted polysilicon pitch of a corresponding semiconductor process/technology.

12. The method of claim 11, further comprising:
setting k=4 such that $\Phi_{(V2L \sim V1C):(V1C \sim V2R)}$ is as follows:

$$\Phi_{(V2L \sim V1C):(V1C \sim V2R)} = 12CPP:16CPP.$$

13. The method of claim 10, further comprising:
setting $\Phi_{[V1(1) \sim V2(1)]:[V2(1) \sim V1(2)]:[V1(2) \sim V2(2)]:[V2(2) \sim V1(3)]}$ as the repeating asymmetric pitch pattern for the conductive layer M(i+1), where:

V1(1) represents a first given one of third segments;
V2(1) represents a first given one of the fourth segments;
V1(2) represents a second given one of third segments;
V2(2) represents a second given one of the fourth segments; and
V1(3) represents a third given one of third segments;
the first and second given ones of the third segments being correspondingly left and right adjacent to the first given one of the fourth segments;
the first and second given ones of the fourth segments being correspondingly left and right adjacent to the second given one of the third segments;
the second and third given ones of the third segments being correspondingly left and right adjacent to the second given one of the fourth segments; and
wherein $\Phi_{[V1(1)-V2(1)]:[V2(1)-V1(2)]:[V1(2)-V2(2)]:[V2(2)-V1(3)]}$ is as follows:

$$\Phi_{[V1(1)-V2(1)]:[V2(1)-V1(2)]:[V1(2)-V2(2)]:[V2(2)-V1(3)]} = 4\lambda:3\lambda:3\lambda:4\lambda;$$

where:
$\lambda$ represents a base distance such that $$\lambda = k * CPP;$$

where:
k being a positive integer; and
CPP representing a contacted polysilicon pitch of a corresponding semiconductor process/technology.

14. The method of claim 13, further comprising:
setting k=4 such that $\Phi_{[V1(1)-V2(1)]:[V2(1)-V1(2)]:[V1(2)-V2(2)]:[V2(2)-V1(3)]}$ is as follows:

$$\Phi_{[V1(1)-V2(1)]:[V2(1)-V1(2)]:[V1(2)-V2(2)]:[V2(2)-V1(3)]} = 16CPP:12CPP:12CPP:16CPP.$$

15. The method of claim 9, further comprising at least one of the following:
making, based on the layout diagram, at least one photolithographic exposure; or
fabricating, based on the layout diagram, one or more semiconductor masks; or
fabricating, based on the layout diagram, at least one component in a layer of a semiconductor integrated circuit.

16. A semiconductor device comprising:
a power grid (PG) arrangement including:
a conductive layer M(i) including segments which are conductive, where i is an integer and i≥0; and
a conductive layer M(i+1) over the conductive layer M(i), the conductive layer M(i+1) including M(i+1) segments which are conductive;
the segments in the conductive M(i) layer including:
first segments designated for a first reference voltage and second segments designated for a second reference voltage, the first and second segments being interspersed and substantially parallel to a first direction;
the segments in the conductive M(i+1) layer including:
third segments designated for the first reference voltage and fourth segments designated for the second reference voltage, the third and fourth segments being interspersed and substantially parallel to a second direction, the second direction being perpendicular to the first direction;
the third segments having a first pitch; and
the fourth segments having the first pitch;
and
wherein:
portions of each of the first and second segments with a length substantially equal to the first pitch have a corresponding stub resistance; and
the first pitch is sized to keep the stub resistance below a threshold resistance.

17. The semiconductor device of claim 16, wherein:
the first pitch is pitch $P_{X3\&4}$;
each of the first and second segments have a second pitch is $P_{Y1\&2}$; and
a ratio of the pitch $P_{Y1\&2}$ to the pitch $P_{X3\&4}$ is ratio=$(P_{Y1\&2})/(P_{X3\&4}) \approx 1/4$.

18. The semiconductor device of claim 17, wherein:
the ratio of the pitch $P_{Y1\&2}$ to the pitch $P_{X3\&4}$ is ratio=$(P_{Y1\&2})/(P_{X3\&4}) \approx 8.4CPP/30CPP$, where CPP represents a contacted polysilicon pitch of a corresponding semiconductor process/technology.

19. The semiconductor device of claim 16, wherein:
the first segments have a second pitch;
the second segments have the second pitch; and
the first pitch is smaller than the first pitch.

20. The semiconductor device of claim 16, wherein:
an arrangement of the segments in the conductive layer M(i+1) is substantially asymmetric such that:
a given third segment is located, relative to the first direction, substantially asymmetrically between corresponding adjacent ones of the third segments; and
a given fourth segment is located, relative to the first direction, substantially asymmetrically between corresponding adjacent ones of the third segments.

* * * * *